US010138393B2

(12) United States Patent
Tomizawa et al.

(10) Patent No.: US 10,138,393 B2
(45) Date of Patent: Nov. 27, 2018

(54) RESIN COMPOSITION, PREPREG, LAMINATE, METAL FOIL-CLAD LAMINATE, AND PRINTED-WIRING BOARD

(71) Applicant: MITSUBISHI GAS CHEMICAL COMPANY, INC., Tokyo (JP)

(72) Inventors: Katsuya Tomizawa, Tokyo (JP); Tomo Chiba, Tokyo (JP); Hiroshi Takahashi, Katsushika-ku (JP); Eisuke Shiga, Katsushika-ku (JP); Daisuke Ueyama, Tokyo (JP); Kentaro Nomizu, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 555 days.

(21) Appl. No.: 14/654,911

(22) PCT Filed: Jan. 14, 2014

(86) PCT No.: PCT/JP2014/050430
§ 371 (c)(1),
(2) Date: Jun. 23, 2015

(87) PCT Pub. No.: WO2014/112464
PCT Pub. Date: Jul. 24, 2014

(65) Prior Publication Data
US 2015/0344733 A1    Dec. 3, 2015

(30) Foreign Application Priority Data

Jan. 15, 2013 (JP) ................................. 2013-004411
Oct. 21, 2013 (JP) ................................. 2013-217997

(51) Int. Cl.
| | |
|---|---|
| C09D 179/08 | (2006.01) |
| C08K 9/04 | (2006.01) |
| C09D 165/00 | (2006.01) |
| C08J 5/24 | (2006.01) |
| C08K 9/06 | (2006.01) |
| C08L 101/00 | (2006.01) |
| C08K 3/34 | (2006.01) |
| C08K 3/36 | (2006.01) |
| C08K 9/08 | (2006.01) |
| H05K 1/03 | (2006.01) |
| C08K 3/22 | (2006.01) |
| C08K 3/28 | (2006.01) |
| C08K 3/38 | (2006.01) |

(52) U.S. Cl.
CPC .............. *C09D 179/08* (2013.01); *C08J 5/24* (2013.01); *C08K 3/34* (2013.01); *C08K 3/36* (2013.01); *C08K 9/04* (2013.01); *C08K 9/06* (2013.01); *C08K 9/08* (2013.01); *C08L 101/00* (2013.01); *C09D 165/00* (2013.01); *H05K 1/0373* (2013.01); *C08K 2003/2227* (2013.01); *C08K 2003/2241* (2013.01); *C08K 2003/282* (2013.01); *C08K 2003/385* (2013.01); *C08K 2201/011* (2013.01); *H05K 2201/0209* (2013.01); *H05K 2201/0239* (2013.01); *Y10T 428/31663* (2015.04); *Y10T 442/2861* (2015.04); *Y10T 442/2992* (2015.04)

(58) Field of Classification Search
CPC ...... C09D 179/08; C09D 165/00; C08K 9/04;
C08K 9/06; C08K 3/34; C08K 3/36;
C08K 9/08; C08K 2003/2227; C08K
2003/2241; C08K 2003/282; C08K
2003/385; C08K 2201/011; C08J 5/24;
C08L 101/00; C08L 83/04; H05K 1/0373;
H05K 2201/0209; H05K 2201/0239;
Y10T 428/31663; Y10T 442/2861; Y10T
442/2992
See application file for complete search history.

(56) References Cited

U.S. PATENT DOCUMENTS

| | | | |
|---|---|---|---|
| 2004/0166324 A1* | 8/2004 | Mishima | .................... C08J 5/10 |
| | | | 428/413 |
| 2010/0086770 A1* | 4/2010 | Roesch | ................ B44C 5/0476 |
| | | | 428/329 |
| 2012/0111621 A1 | 5/2012 | Ohigashi et al. | |
| 2012/0288700 A1 | 11/2012 | Mcmullin et al. | |

FOREIGN PATENT DOCUMENTS

| | | |
|---|---|---|
| CN | 102482481 | 5/2012 |
| CN | 102753628 | 10/2012 |
| JP | 2001-348488 | 12/2001 |
| JP | 2003-073543 | 3/2003 |
| JP | 2003-268136 | 9/2003 |
| JP | 2008-037898 | 2/2008 |
| JP | 2010-519068 | 6/2010 |

(Continued)

OTHER PUBLICATIONS

Search Report issued in PCT/JP2014/050430, dated Apr. 1, 2014.
Michael Berkei, "Understanding the Mechanism of improved Scratch and Abrasion Resistance in Authomotive Coatings using Surface", European Coatings Conference, Nov. 24, 2011, pp. 39.

*Primary Examiner* — Cephia D Toomer

(74) *Attorney, Agent, or Firm* — Greenblum & Bernstein, P.L.C.

(57) ABSTRACT

The present invention provides a resin composition including: nanoparticles (A) of alumina and/or boehmite having an average particle size of 1.0 nm to 100 nm; fine particles (B) having an average particle size of 0.20 μm to 100 μm; and a thermosetting resin (C), wherein the nanoparticles (A) have their surfaces treated with a polysiloxane-based modifier.

23 Claims, No Drawings

(56) References Cited

FOREIGN PATENT DOCUMENTS

| | | |
|---|---|---|
| JP | 2012-102169 | 5/2012 |
| JP | 2012-131946 | 7/2012 |
| JP | 2012-131947 | 7/2012 |
| JP | 2012-153752 | 8/2012 |
| TW | 2011-09359 | 3/2011 |
| WO | 2011/010672 | 1/2011 |

\* cited by examiner

RESIN COMPOSITION, PREPREG, LAMINATE, METAL FOIL-CLAD LAMINATE, AND PRINTED-WIRING BOARD

TECHNICAL FIELD

The present invention relates to a resin composition, a prepreg, laminate, a metal foil-clad laminate, and a printed-wiring board.

BACKGROUND ART

High integration or high-density packaging has been increasingly accelerated in recent years as semiconductor packages widely used in electronics, communication devices, personal computers, etc. have been more highly functionalized and/or miniaturized. Along with this, diverse requirements are imposed on laminates for use in such semiconductor packages. In addition to heat resistance and reliability, various characteristics such as low thermal expansion, high heat conductivity, and high elasticity have been demanded.

Among them, particularly, laminates having low thermal expansion have been strongly desired. This is due to the following factor: a semiconductor device and a printed-wiring board for a semiconductor plastic package largely differ in the coefficient of thermal expansion, and this difference in thermal expansion causes the warpage of the semiconductor plastic package upon application of thermal shock during the production process. As a result, poor connection occurs between the semiconductor device and the printed-wiring board for the semiconductor plastic package or between the semiconductor plastic package and the on-board printed-wiring board. Accordingly, the laminate having low thermal expansion is used with the aim of minimizing such difference in thermal expansion.

In addition, high heat conductivity has also been strongly desired for laminates in recent years. This is because an opportunity to use semiconductor plastic packages in high-temperature environments has been increased as indicated by, for example, research on the mounting of engine control units on automotive drive divisions, or because the amount of heat generation is increased due to an increased number of parts to be installed in association with high integration or high-density packaging. Approaches such as studied heat sinks or radiation fins and laminates equipped with thermal vias have been adopted as countermeasures against heat. These approaches, however, are less than sufficient. Thus, higher heat conductivity has been demanded for enhancing the radiation of laminates themselves.

A method which involves filling of a high proportion of a filler excellent in various characteristics is known as a method for imparting low thermal expansion or high heat conductivity to laminates (see e.g., Patent Documents 1 to 3). Also, the high filling of the filler is used as an approach useful in the high functionalization of laminates, because this approach can not only impart low thermal expansion or high heat conductivity to the laminates but improve mechanical characteristics (e.g., modulus of elasticity), resistance to burning, electric characteristics, and whiteness.

CITATION LIST

Patent Document

Patent Document 1: Japanese Patent Laid-Open No. 2003-73543

Patent Document 2: Japanese Patent Laid-Open No. 2003-268136

Patent Document 3: Japanese Patent Laid-Open No. 2001-348488

SUMMARY OF INVENTION

Technical Problem

Nonetheless, the present inventors have found that the filling of a high proportion of the filler to laminates in order to impart thereto characteristics such as low thermal expansion or high heat conductivity causes the following problems:
(1) the decreased volume ratio of a resin composition reduces fluidity and consequently deteriorates the viscosity of a prepreg that is obtained by the impregnation of a substrate such as glass cloth with the resin composition followed by semi-curing;
(2) such a prepreg causes cracks or voids in a metal foil-clad laminate that is obtained by the curing of the prepreg laminated on a metal foil, resulting in poor moldability; and
(3) the occurrence of such voids deteriorates the heat resistance after moisture absorption and the modulus of elasticity of the metal foil-clad laminate, and the adhesion strength between the copper foil and an insulating layer containing the laminate.

The present invention has been made in light of these problems, and an object of the present invention is to provide a resin composition from which a prepreg having low viscosity convenient for the preparation of a metal foil-clad laminate can be prepared and also permits preparation of a metal foil-clad laminate excellent in heat resistance after moisture absorption, and to provide a prepreg, a laminate, and a printed-wiring board prepared using the resin composition.

Solution to Problem

The present inventors have conducted diligent studies to solve the problems mentioned above, have found that a resin composition containing specific nanoparticles in combination with fine particles having a specific particle size and a thermosetting resin can attain the object, and as a result have achieved the present invention.

Specifically, the present invention is as follows:
[1] A resin composition including: nanoparticles (A) of alumina and/or boehmite having an average particle size from 1.0 nm or more to 100 nm or less; fine particles (B) having an average particle size from 0.20 μm or more to 100 μm or less; and a thermosetting resin (C), wherein the nanoparticles (A) have their surfaces treated with a polysiloxane-based modifier.
[2] The resin composition according to [1], wherein the nanoparticles (A) are treated with one or more dispersing agents selected from the group consisting of phosphoric acid ester, phosphoric acid ester salt, and alkylbenzenesulfonic acid.
[3] The resin composition according to [1] or [2], wherein the resin composition contains 200 parts by mass or larger of the fine particles (B) based on 100 parts by mass of the thermosetting resin (C).
[4] The resin composition according to any of [1] to [3], wherein the fine particles (B) are one or more selected from the group consisting of silica, alumina, aluminum nitride, boron nitride, boehmite, titanium oxide, silicone rubber, and hybrid silicone powder.

[5] The resin composition according to any of [1] to [4], wherein the nanoparticles (A) are dispersed as primary particles in a solvent or a resin.
[6] The resin composition according to any of [1] to [5], wherein the thermosetting resin (C) is one or more selected from the group consisting of a cyanate ester compound (D), a phenol resin (E), a maleimide compound (F), an epoxy resin (G), and a BT resin (H).
[7] The resin composition according to any of [1] to [6], wherein the cyanate ester compound (D) is a compound represented by the following formula (2) and/or the following formula (3):

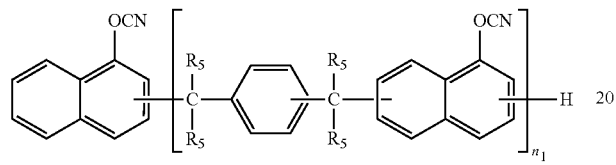

wherein each $R_5$ independently represents a hydrogen atom or a methyl group, and $n_1$ represents an integer of 1 or larger; and

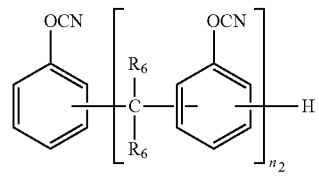

wherein each $R_6$ independently represents a hydrogen atom or a methyl group, and $n_2$ represents an integer of 1 or larger.
[8] The resin composition according to any of [1] to [7], wherein the maleimide compound (F) is one or more selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following formula (6):

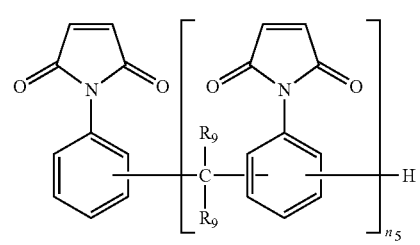

wherein each $R_9$ independently represents a hydrogen atom or a methyl group, and $n_5$ represents an integer of 1 or larger.
[9] The resin composition according to any of [1] to [8], wherein the epoxy resin (G) is one or more selected from the group consisting of compounds represented by the following formulas (7), (8), (9), (11), and (12):

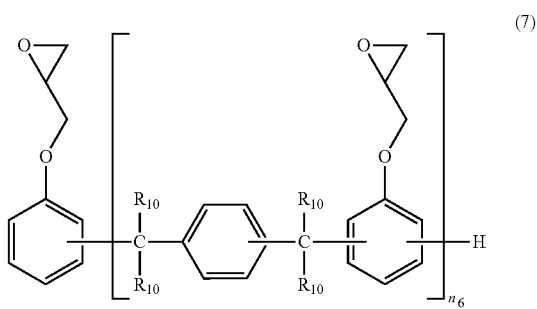

wherein each $R_{10}$ independently represents a hydrogen atom or a methyl group, and $n_6$ represents an integer of 1 or larger;

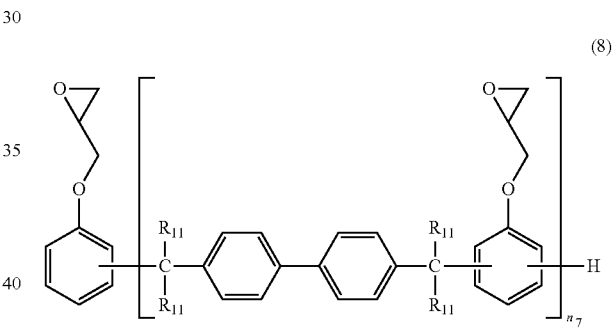

wherein each $R_{11}$ independently represents a hydrogen atom or a methyl group, and $n_7$ represents an integer of 1 or larger;

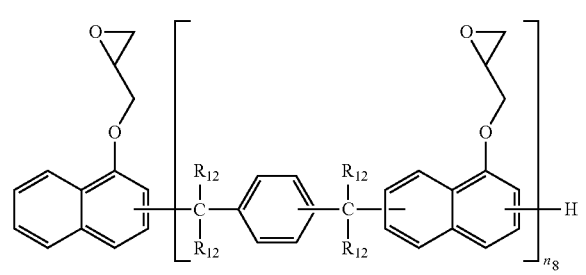

wherein each $R_{12}$ independently represents a hydrogen atom or a methyl group, and $n_8$ represents an integer of 1 or larger;

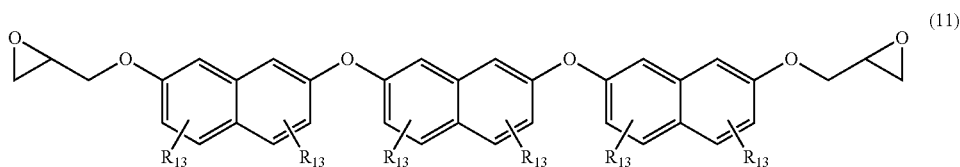

wherein each $R_{13}$ independently represents a hydrogen atom or a methyl group; and

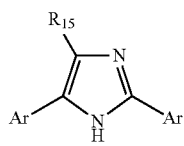

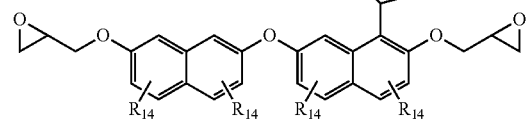

wherein each $R_{14}$ independently represents a hydrogen atom, an alkyl group having 1 to 4 carbon atoms, or an aralkyl group containing an alkyl moiety having 1 to 4 carbon atoms.

[10] The resin composition according to any of [1] to [9], wherein the phenol resin (E) is one or more selected from the group consisting of a cresol novolac-based phenol resin, an aminotriazine novolac-based phenol resin, a naphthalene-based phenol resin, a naphthol aralkyl-based phenol resin represented by the following formula (4), and a biphenyl aralkyl-based phenol resin represented by the following formula (5):

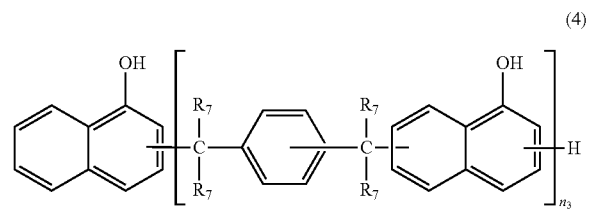

wherein each $R_7$ independently represents a hydrogen atom or a methyl group, and $n_3$ represents an integer of 1 or larger; and

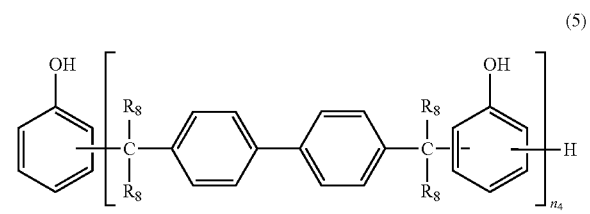

wherein each $R_8$ independently represents a hydrogen atom or a methyl group, and $n_4$ represents an integer of 1 or larger.

[11] The resin composition according to any of [1] to [10], further including an imidazole compound represented by the following formula (13):

wherein each Ar independently represents a phenyl group, a naphthyl group, a biphenyl group, or an anthracenyl group, or a hydroxy group-modified product thereof, and $R_{15}$ represents a hydrogen atom, an alkyl group or a hydroxy group-modified product thereof, or an aryl group.

[12] The resin composition according to any of [1] to [11], wherein the resin composition contains from 0.010% by mass or more to 5% by mass or less of the alumina nanoparticles (A) based on the total mass of the fine particles (B).

[13] The resin composition according to any of [1] to [12], wherein the thermosetting resin (C) contains from 10 parts by mass or more to 60 parts by mass or less of the cyanate ester compound (D) based on 100 parts by mass in total of the thermosetting resin (C).

[14] The resin composition according to any of [1] to [13], wherein the thermosetting resin (C) contains from 10 parts by mass or more to 60 parts by mass or less of the phenol resin (E) based on 100 parts by mass in total of the thermosetting resin (C).

[15] The resin composition according to any of [1] to [14], wherein the thermosetting resin (C) contains 3.0 parts by mass or more to 50 parts by mass or less of the maleimide compound (F) based on 100 parts by mass in total of the thermosetting resin (C).

[16] The resin composition according to any of [1] to [15], wherein the thermosetting resin (C) contains from 10 parts by mass or more to 80 parts by mass or less of the epoxy resin (G) based on 100 parts by mass in total of the thermosetting resin (C).

[17] The resin composition according to any of [1] to [16], wherein the thermosetting resin (C) contains from 20 parts by mass or more to 80 parts by mass or less of the BT resin (H) based on 100 parts by mass in total of the thermosetting resin (C).

[18] The resin composition according to any of [1] to [17], wherein the nanoparticles (A) are alumina nanoparticles.

[19] A prepreg including a substrate and a resin composition according to any of [1] to [18], wherein the substrate is impregnated or coated with the resin composition.

[20] The prepreg according to [19], wherein the substrate is one or more selected from the group consisting of E glass cloth, T glass cloth, S glass cloth, Q glass cloth, and an organic fiber.

[21] A laminate including at least one prepreg according to [19] or [20].

[22] A metal foil-clad laminate including a prepreg according to [19] or [20] and a metal foil laminated on the prepreg.

[23] A printed-wiring board including an insulating layer and a conductor layer formed on the surface of the insulating layer, wherein the insulating layer includes a resin composition according to any of [1] to [18].

Advantageous Effects of Invention

The present invention can provide a resin composition from which a prepreg having low viscosity convenient for the preparation of a metal foil-clad laminate can be prepared and also permits preparation of a metal foil-clad laminate excellent in heat resistance after moisture absorption, and can provide a prepreg, a laminate, and a printed-wiring board prepared using the resin composition.

DESCRIPTION OF EMBODIMENTS

Hereinafter, a mode for carrying out the present invention (hereinafter, simply referred to as the "present embodiment") will be described in detail. The present embodiment described below is given merely for illustrative purposes. The present invention is not intended to be limited by the present embodiment, and various changes or modifications can be made in the present invention without departing from the spirit thereof.

The resin composition of the present embodiment includes: nanoparticles (A) of alumina and/or boehmite having an average particle size from 1.0 nm or more to 100 nm or less; fine particles (B) having an average particle size from 0.20 μm or more to 100 μm or less; and a thermosetting resin (C), wherein the nanoparticles (A) have their surfaces treated with a polysiloxane-based modifier.

In the present embodiment, the alumina in the nanoparticles (A) of alumina and/or boehmite having an average particle size of from 1.0 nm or more to 100 nm or less is aluminum oxide represented by the chemical formula $Al_2O_3$. The boehmite in the nanoparticles (A) is a hydrate of alumina. The nanoparticles (A) are not particularly limited by their crystal structures as long as the nanoparticles have an average particle size (D50) from 1.0 nm or more to 100 nm or less. Examples of the alumina include α-type alumina, β-type alumina, γ-type alumina, and S-type alumina. In this context, "D50" is a median diameter and is a particle size at which, when the measured particle size distribution of a powder is divided into two portions, particles having a larger volume and particles having a smaller volume respectively occupy 50% of the whole powder. In general, D50 is measured by a wet laser diffraction/scattering method.

In the resin composition, such nanoparticles (A) are considered to have an effect of entering into between a plurality of fine particles (B) (hereinafter, also referred to as a "filler") described later in detail to lubricate the filler. Accordingly, the nanoparticles (A), even in a resin composition having a large filler content, can prevent the aggregation of filler particles and solve various expected defects caused by the large filler content in the resulting laminate. The nanoparticles (A) preferably include alumina nanoparticles from the viewpoint of exerting such an effect effectively and reliably.

The nanoparticles (A) used in the present embodiment are not particularly limited by their production method. Alternatively, a commercially available product may be used. Among others, the method for producing the alumina nanoparticles (A) is not particularly limited and is preferably plasma gas-phase synthesis for production because the alumina nanoparticles (A) are nonporous and have a small bulk. The plasma gas-phase synthesis is a production method which involves evaporating a metal or metal oxide at a high temperature by means of plasma energy, and adding thereto a reaction gas such as oxygen, followed by cooling. The small bulk can suppress the confinement of the thermosetting resin (C) by the alumina nanoparticle surface, which constitutes a cause of deterioration in moldability. The effect of improving moldability by the alumina nanoparticles can therefore be achieved more effectively and reliably.

Also, the nanoparticles (A) used in the present embodiment preferably have a reactive group. Examples of the reactive group include a hydroxy group and a group having a halogen atom. Among them, a hydroxy group is preferred and is preferably positioned so as to react with a modifier mentioned later.

The nanoparticles (A) used in the present embodiment have their surfaces treated.

This surface treatment is carried out using a polysiloxane-based modifier, i.e., a modifier having a polysiloxane skeleton as a main skeleton. The modifier is preferably adsorbed onto the surface of the nanoparticles (A) through chemical interaction. Preferred examples thereof include polysiloxane represented by the following formula (1). In this context, in the following formula (1), x represents an integer of 0 to 2 and is preferably 0; y represents an integer of 1 to 10 and is preferably an integer of 2 to 5; and $R^1$ represents a monovalent organic group having 1 to 18, preferably 1 to 10, more preferably 1 to 3 carbon atoms. $R^2$ represents a monovalent organic group optionally having a heteroatom and/or a substituent and preferably represents a hydroxy group or a hydrolyzable group. The hydrolyzable group represents a linear, branched, or cyclic alkoxy group having 1 to 6, preferably 1 to 2 carbon atoms; a halogen atom, preferably a chlorine atom; or a carboxylic acid group having 1 to 4, preferably 1 to 2 carbon atoms. $R^3$ represents a divalent organic group optionally having a heteroatom or a substituent and is preferably an oxygen atom; a linear or branched (preferably linear) alkylene group having 1 to 8 carbon atoms; an alkylene ether group; an alkylene thioether group; an alkylene polyether group preferably based on ethylene oxide, propylene oxide, butylene oxide, or styrene oxide, or a mixture of these oxides or based on statistic or block polyether; an arylene polyether group; an alkylene polyester group; or an organic aliphatic, aromatic, or allyl aliphatic group having urethane and/or urea groups in addition to ester and/or ether groups. $R^4$ is partially and independently substituted by one or more modifying groups (G), each of which is a monovalent or polyvalent substituent having 4 to 200 siloxane structural units and an alkyl group having 1 to 18 carbon atoms on the silicon atom, wherein the alkyl group having 1 to 18 carbon atoms is selected from a group (G1) having a polyether group, a group (G2) having a polyester group, a group (G3) having an aryl alkyl group, and a group (G4) having a perfluorinated alkyl group.

$$(R^1{}_xR^2{}_{3-x}SiR^3)_yR^4 \qquad (1)$$

The surface treatment with such a modifier can prevent the aggregation of the fine particles (B) in the resin composition and keep the fluidity in the resin composition high. Particularly, the selective surface treatment of the nanoparticles (A) with the modifier can enhance lubricity in the contact between the nanoparticles (A) that have entered into between the fine particles (B), and is therefore considered to be able to contribute more effectively to reduction in the viscosity of a prepreg. Since the modifier is less likely to react with the thermosetting resin (C), the surface treatment can prevent the confinement of the nanoparticles (A) by the thermosetting resin (C) and more effectively enhance the lubricity.

In the surface treatment, the polysiloxane-based modifier may be used in combination with one or more dispersing agents selected from the group consisting of phosphoric acid ester, phosphoric acid ester salt, and alkylbenzenesulfonic acid. Particularly, the polysiloxane-based modifier is preferably used in combination with phosphoric acid ester and alkylbenzenesulfonic acid.

The polysiloxane-based modifier effectively can prevent the aggregation of the particles by reducing the surface tension of the particles. In addition, the auxiliary use of the dispersing agents such as phosphoric acid ester and alkylbenzenesulfonic acid can stabilize the dispersed state by causing steric hindrance on the particle surface.

As for the modifying group (G), the group (G1) having a polyether group is based on one or two or more alkylene oxides represented by the following formula (1A):

(1A)

wherein, R' preferably represents a hydrogen atom, a phenyl group, or an alkyl group. The group (G1) preferably has a molecular weight within the range of 116 to 15000 daltons.

The group (G2) having a polyester group preferably has one or more selected from the group consisting of: a group having aliphatic, alicyclic, and/or aromatic polyester groups or a group having one of these groups; a group represented by the following formula (1B):

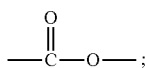

(1B)

and a group represented by the following formula (1C):

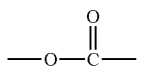

(1C)

and preferably has all of these three groups. The group (G2) preferably has a molecular weight within the range from 344 daltons or more to 4000 daltons or less, more preferably within the range from 500 daltons or more to 2000 daltons or less, further preferably within the range from 500 daltons or more to 1500 daltons or less.

The group (G3) having an aryl alkyl group is preferably a phenylpropyl group or a group having this group. More preferably, the phenylpropyl group is a 2-phenylpropyl group.

The group (G4) having a perfluorinated alkyl group is preferably a perfluorinated alkyl group having 3 to 8 carbon atoms, or a group having this group. Alternatively, the group (G4) is preferably a tetrahydro perfluorinated alkyl group having 3 to 8 carbon atoms, or a group having this group. More preferably, the tetrahydro perfluorinated alkyl group is a 1,1,2,2-tetrahydro perfluorinated alkyl group.

The nanoparticles (A) preferably contain from 0.01% by mass or more to 50% by mass or less, more preferably 0.05% by mass or more to 30% by mass or less, further preferably 0.1% by mass or more to 15% by mass or less, of the modifier based on the total mass of the nanoparticles (A).

Also preferably, the nanoparticles (A) are dispersed as primary particles in a solvent or a resin. Such nanoparticles are stably present as primary particles in the resin composition so that the nanoparticles (A) can more sufficiently exert its effect as a lubricant for the fine particles (B).

The nanoparticles (A) are not particularly limited by their shapes. A spherical shape is preferred from the viewpoint of enhancing the fluidity in the resin composition.

A commercially available product that has undergone dispersion treatment may be used as the nanoparticles (A) according to the present embodiment. Examples of the product of the alumina nanoparticles include NANOBYK-3610 (product name) manufactured by BYK Japan K.K. Examples of the product of the boehmite nanoparticles include LP-X-21121 (product name) manufactured by BYK Japan K.K.

The content of the nanoparticles (A) used in the present embodiment in the resin composition is preferably from 0.01% by mass or more to 10.0% by mass or less based on the total mass (100% by mass) of the fine particles (B). When the content of the fine particles (B) is within the preferred range, the viscosity of a prepreg can be more effectively reduced. From a similar viewpoint, the content of the nanoparticles (A) is more preferably from 0.1% by mass or more to 5.0% by mass or less based on the total mass of the fine particles (B).

In this context, the "total mass of the fine particles (B)" refers to the sum of the masses of various inorganic fillers, organic fillers, and organic/inorganic hybrid fillers mentioned later.

Examples of the fine particles (B) having an average particle size of from 0.20 μm or larger to 100 μm or smaller used in the resin composition of the present embodiment include inorganic fillers, organic fillers, and inorganic/organic hybrid fillers. More specific examples thereof include silica (e.g., natural silica, fused silica, amorphous silica, and hollow silica), alumina, aluminum nitride, boron nitride, boehmite, molybdenum oxide, titanium oxide, silicone rubber, hybrid silicone powder, zinc borate, zinc stannate, clay, kaolin, talc, fired clay, fired kaolin, fired talc, mica, short glass fiber (fine glass powders such as E glass and D glass), hollow glass, and spherical glass. These fine particles (B) may be used singly or as a mixture of two or more.

Among them, silica is preferred from the viewpoint of easily conferring lower thermal expansion. Also, alumina and aluminum nitride are preferred from the viewpoint of easily conferring higher heat conductivity.

The average particle size (D50) of the fine particles (B) needs to be from 0.20 μm or larger to 100 μm or smaller from the viewpoint that the nanoparticles (A) enter into the gaps between the fine particles (B) and play a sufficient role as a lubricant. The average particle size is preferably from 0.20 μm or larger to 10 μm or smaller from the viewpoint that finer wiring can be formed. The average particle size is more preferably from 0.20 μm or larger to 5 μm or smaller.

The fine particles (B) are not particularly limited by their particle shapes. A spherical shape is preferred from the viewpoint of moldability.

The content of the fine particles (B) according to the present embodiment in the resin composition is preferably 200 parts by mass or more, more preferably 250 parts by mass or more, based on 100 parts by mass of the thermosetting resin (C) from the viewpoint of the characteristics of the fine particles (B) conferred to the resin composition.

The upper limit of the content of the fine particles (B) in the resin composition is not particularly limited and is preferably 500 parts by mass or less. The upper limit is more preferably 400 parts by mass or less from the viewpoint of enhancing moldability. When better heat conductivity is required, the content of the fine particles (B) is preferably 1100 parts by mass or less, more preferably 700 parts by mass or less, because such a filler having high heat conductivity generally has a large specific gravity in most cases.

The resin composition of the present embodiment may contain, in addition to the fine particles (B), a silane coupling agent and/or a wetting and dispersing agent in order to improve the dispersibility of the fine particles (B) and the adhesion strength between the resin and the fine particles (B) or glass cloth. The silane coupling agent is not particularly limited as long as the silane coupling agent is generally used in the surface treatment of inorganic matter. Specific examples thereof include: aminosilane derivatives such as γ-aminopropyltriethoxysilane and N-β-(aminoethyl)-γ-aminopropyltrimethoxysilane; epoxysilane derivatives such as γ-glycidoxypropyltrimethoxysilane; vinylsilane derivatives such as γ-methacryloxypropyltrimethoxysilane; cationic silane derivatives such as N-β-(N-vinylbenzylaminoethyl)-γ-aminopropyltrimethoxysilane hydrochloride; and phenylsilane derivatives. These silane coupling agents may be used singly or in combinations of two or more. The wetting and dispersing agent is not particularly limited as long as the wetting and dispersing agent is used as a dispersion stabilizer for paint. Examples of the wetting and dispersing agent include wetting and dispersing agents such as Disperbyk-110, -111, -180, and -161, BYK-W996, -W9010, and -W903 (all are product names) manufactured by BYK Japan K.K.

The thermosetting resin (C) in the resin composition according to the present embodiment is not particularly limited as long as the resin is thermally curable. Examples thereof include a cyanate ester compound (D), a phenol resin (E), a maleimide compound (F), an epoxy resin (G), and a BT resin (H). These thermosetting resins (C) can be used singly or in combinations of two or more.

The cyanate ester compound (D) has characteristics excellent in chemical resistance and adhesion properties, etc., and as such, can be suitably used as a component in the resin composition according to the present embodiment.

The cyanate ester compound (D) is not particularly limited by its type, and examples thereof include a naphthol aralkyl-based cyanate ester compound represented by the following formula (2), a novolac-based cyanate ester represented by the following formula (3), biphenyl aralkyl-based cyanate ester, bis(3,5-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl)thioether, bis(4-cyanatophenyl)sulfone, and 2,2-bis(4-cyanatophenyl)propane.

Among them, a naphthol aralkyl-based cyanate ester compound represented by the following formula (2), a novolac-based cyanate ester represented by the following formula (3), and biphenyl aralkyl-based cyanate ester are particularly preferred because of having excellent flame retardance and higher curability and conferring a lower coefficient of thermal expansion to a cured product:

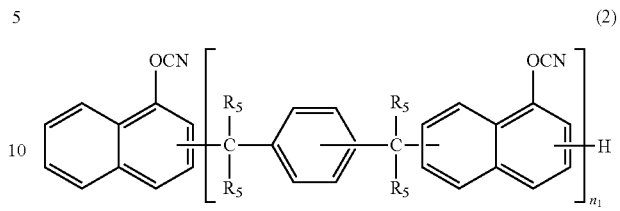

(2)

In the above formula, each $R_5$ independently represents a hydrogen atom or a methyl group and is particularly preferably a hydrogen atom. $n_1$ represents an integer of 1 or larger. The upper limit of $n_1$ is usually 10, preferably 6.

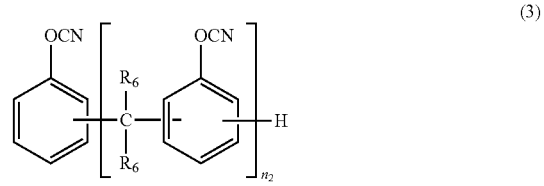

(3)

In the above formula, each $R_6$ independently represents a hydrogen atom or a methyl group and is particularly preferably a hydrogen atom. $n_2$ represents an integer of 1 or larger. The upper limit of $n_2$ is usually 10, preferably 7.

These cyanate ester compounds are not particularly limited by their production methods and may be produced by any existing method for cyanate ester synthesis. As a specific example, the cyanate ester compound can be obtained by reacting a naphthol aralkyl-based phenol resin represented by the following formula (4) with cyanogen halide in the presence of a basic compound in an inert organic solvent. Alternatively, the cyanate ester compound may be obtained by a method which involves forming a salt of a similar naphthol aralkyl-based phenol resin and a basic compound in a solution containing water, then reacting the salt with cyanogen halide through two-phase interfacial reaction to synthesize the compound.

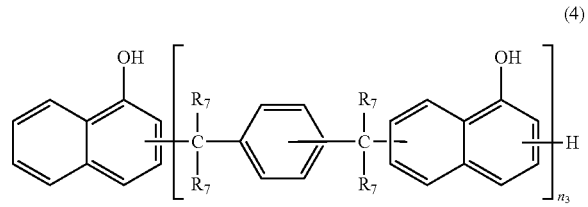

(4)

In the above formula, each $R_7$ independently represents a hydrogen atom or a methyl group and is particularly preferably a hydrogen atom. $n_3$ represents an integer of 1 or larger. The upper limit of $n_3$ is usually 10, preferably 6.

The naphthol aralkyl-based cyanate ester compound can be selected from those obtained by condensing cyanic acid with a naphthol aralkyl resin obtained through the reaction of a naphthol such as α-naphthol or β-naphthol with p-xylylene glycol, α,α'-dimethoxy-p-xylene, 1,4-di(2-hydroxy-2-propyl)benzene, or the like.

When the cyanate ester compound (D) and the epoxy resin (G) coexist with each other in the resin composition of the present embodiment, these components are preferably contained therein such that the ratio (CN/Ep) of the number CN of cyanate groups in the cyanate ester compound (D) to the number Ep of epoxy groups in the epoxy resin (G) is from 0.7 or more to 2.5 or less, from the viewpoint of heat resistance, flame retardance, and the rate of water absorption.

In the case of using the cyanate ester compound (D) in the present embodiment, the content of the cyanate ester compound (D) in the thermosetting resin (C) is from 10 parts by mass or more to 60 parts by mass or less, more preferably from 20 parts by mass or more to 50 parts by mass or less, based on 100 parts by mass in total of the thermosetting resin (C), from the viewpoint of curability and heat resistance.

In this context, the total of the thermosetting resin (C) means the sum of the amounts of the thermosetting resins such as the cyanate ester compound (D), the phenol resin (E), the maleimide compound (F), the epoxy resin (G), and the BT resin (H). This sum excludes the amounts of a curing accelerator and the wetting and dispersing agent and the silane coupling agent added to the fine particles (B).

Any known resin having two or more phenolic hydroxy groups in one molecule can be appropriately used as the phenol resin (E) without particular limitations to its type. Examples of the phenol resins (E) include cresol novolac-based phenol resins, phenol novolac resins, alkylphenol novolac resins, bisphenol A-based novolac resins, dicyclopentadiene-based phenol resins, Zylock-based phenol resins, terpene-modified phenol resins, polyvinylphenols, naphthol aralkyl-based phenol resins represented by the formula (4), biphenyl aralkyl-based phenol resins represented by the following formula (5), naphthalene-based phenol resins, and aminotriazine novolac-based phenol resins. These resins can be used singly or in combinations of two or more according to the purpose.

Among them, a cresol novolac-based phenol resin, an aminotriazine novolac-based phenol resin, a naphthalene-based phenol resin, a naphthol aralkyl-based phenol resin represented by the formula (4), and a biphenyl aralkyl-based phenol resin represented by the following formula (5) are preferred from the viewpoint of water absorbability and heat resistance. In particular, a cresol novolac-based phenol compound, a naphthol aralkyl-based phenol resin represented by the formula (4), and a biphenyl aralkyl-based phenol resin represented by the following formula (5) are more preferred.

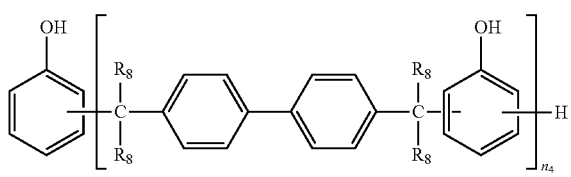

(5)

In the above formula, each $R_8$ independently represents a hydrogen atom or a methyl group and is particularly preferably a hydrogen atom. $n_4$ represents an integer of 1 or larger. The upper limit of $n_4$ is usually 10, preferably 7.

When the phenol resin (E) and the epoxy resin (G) coexist with each other in the resin composition of the present embodiment, these components are preferably contained therein such that the ratio (OH/Ep) of the number OH of hydroxy groups in the phenol resin (E) to the number Ep of epoxy groups in the epoxy resin (G) is from 0.7 or more to 2.5 or less, from the viewpoint of glass transition temperature and flame retardance.

In the case of using the phenol resin (E) in the present embodiment, the content of the phenol resin (E) in the thermosetting resin (C) is preferably from 10 parts by mass or more to 60 parts by mass or less, more preferably 20 parts by mass or more to 50 parts by mass or less, based on 100 parts by mass in total of the thermosetting resin (C) from the viewpoint of curability and heat resistance.

The maleimide compound (F) is not particularly limited as long as the compound has one or more maleimide groups in one molecule. Specific examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, and a maleimide compound represented by the following formula (6), and prepolymers of these maleimide compounds, and prepolymers of these maleimide compounds and amine compounds. These maleimide compounds may be used singly or as a mixture of two or more.

Among them, bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following formula (6) are preferred, and in particular, a maleimide compound represented by the following formula (6) is preferred:

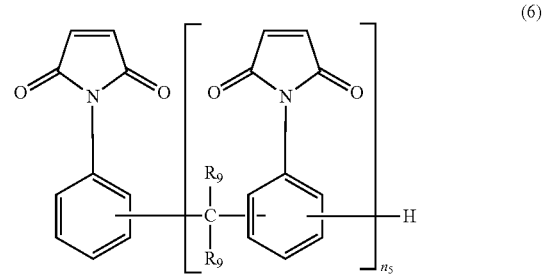

In the above formula, each $R_9$ independently represents a hydrogen atom or a methyl group and is particularly preferably a hydrogen atom. $n_5$ represents an integer of 1 or larger. The upper limit of $n_5$ is usually 10, preferably 7.

In the case of using the maleimide compound (F) in the present embodiment, the content of the maleimide compound (F) in the thermosetting resin (C) is preferably from 3 parts by mass or more to 50 parts by mass or less, more preferably 5 parts by mass or more to 40 parts by mass or less, based on 100 parts by mass in total of the thermosetting resin (C) from the viewpoint of curability and heat resistance.

The epoxy resin (G) is not particularly limited as long as the compound has two or more epoxy groups in one molecule. Examples thereof include: a phenol phenyl aralkyl-based epoxy resin represented by the following formula (7), a phenol biphenyl aralkyl-based epoxy resin represented by the following formula (8), and a naphthol aralkyl-based epoxy resin represented by following formula (9); and, for decreasing the coefficient of thermal expansion, an anthraquinone-based epoxy resin represented by the following formula (10), and a polyoxynaphthylene-based epoxy resin represented by the following formula (11) or (12). Other examples thereof include: compounds epoxidized at the double bond, such as bisphenol A-based epoxy resins, bisphenol F-based epoxy resins, phenol novolac-based epoxy resins, cresol novolac-based epoxy resins, bisphenol A novolac-based epoxy resins, trifunctional phenol-based epoxy resins, tetrafunctional phenol-based epoxy resins, naphthalene-based epoxy resins, biphenyl-based epoxy resins, aralkyl novolac-based epoxy resins, brominated bisphenol A-based epoxy resins, brominated phenol novolac-based epoxy resins, phosphorus-containing epoxy resins, alicyclic epoxy resins, polyol-based epoxy resins, glycidylamine, glycidyl ester, and butadiene; and compounds obtained through the reaction of hydroxy group-containing silicone resins with epichlorohydrin. Among them, particularly, a phenol phenyl aralkyl-based epoxy resin represented by the following formula (7), a phenol biphenyl aralkyl-based epoxy resin represented by the following formula (8), a naphthol aralkyl-based epoxy resin represented by the following formula (9), an anthraquinone-based epoxy resin represented by the following formula (10), and a polyoxynaphthylene-based epoxy resin represented by the following formula (11) or (12) are preferred for improving flame retardance. These epoxy resins may be used singly or as a mixture of two or more.

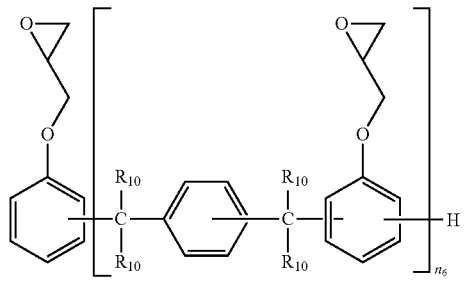

(7)

In the above formula, each $R_{10}$ independently represents a hydrogen atom or a methyl group and is preferably a hydrogen atom. $n_6$ represents an integer of 1 or larger. The upper limit of $n_6$ is usually 10, preferably 7.

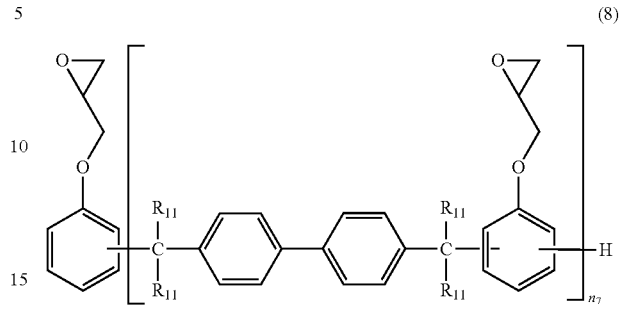

(8)

In the above formula, each $R_{11}$ independently represents a hydrogen atom or a methyl group and is particularly preferably a hydrogen atom. $n_7$ represents an integer of 1 or larger. The upper limit of $n_7$ is usually 10, preferably 7.

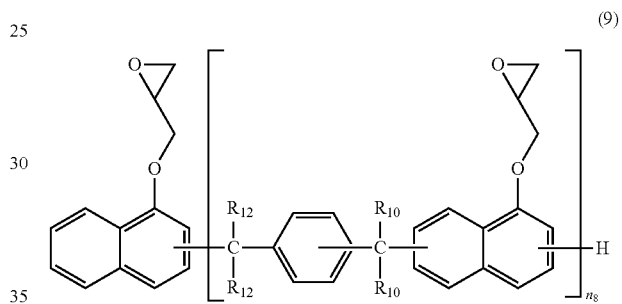

(9)

In the above formula, $R_{12}$ represents a hydrogen atom or a methyl group and is particularly preferably a hydrogen atom. $n_8$ represents an integer of 1 or larger. The upper limit of $n_8$ is usually 10, preferably 7.

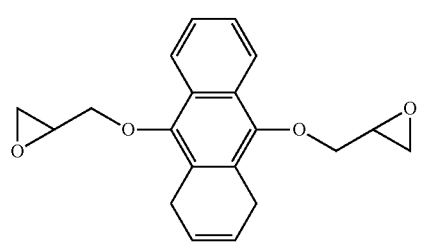

(10)

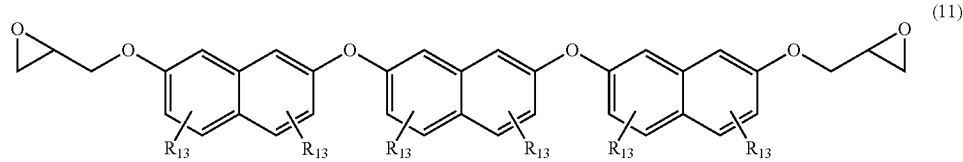

(11)

In the above formula, each $R_{13}$ independently represents a hydrogen atom, an alkyl group having 1 to 4 carbon atoms, or an aralkyl group containing an alkyl moiety having 1 to 4 carbon atoms.

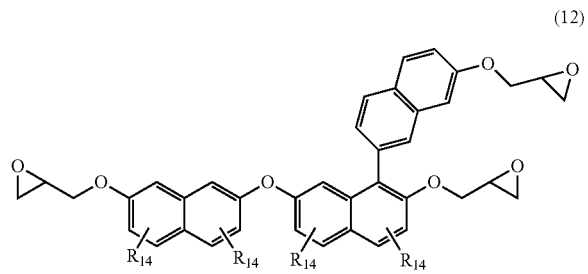

(12)

In the above formula, each $R_{14}$ independently represents a hydrogen atom, an alkyl group having 1 to 4 carbon atoms, or an aralkyl group containing an alkyl moiety having 1 to 4 carbon atoms.

A commercially available product can be used as the epoxy resin represented by the formula (11) or (12). Examples of the product include EXA-7311, EXA-7311-G3, EXA-7311-G4, EXA-7311-G4S, EXA-7311L, HP-6000, and EXA-7311-G5 (all are product names) manufactured by DIC Corp.

In the case of using the epoxy resin (G) in the present embodiment, the content of the epoxy resin (G) in the thermosetting resin (C) is preferably from 10 parts by mass or more to 80 parts by mass or less, more preferably from 20 parts by mass or more to 70 parts by mass or less, based on 100 parts by mass in total of the thermosetting resin (C) from the viewpoint of curability or heat resistance. When the content of the epoxy resin (G) is within the preferred range, the curing degree of the thermosetting resin can be further enhanced. Thus, a printed-wiring board excellent in flame retardance, glass transition temperature, the rate of water absorption, and the modulus of elasticity can be obtained.

The BT resin (H) is a polymer obtained by dissolving a cyanate ester compound and a maleimide compound without a solvent or in an organic solvent such as methyl ethyl ketone, N-methylpyrrolidone, dimethylformamide, dimethylacetamide, toluene, or xylene, followed by heating and mixing.

Examples of the cyanate ester compound for use in the synthesis of the BT resin (H) include, but are not particularly limited to, naphthol aralkyl-based cyanate ester compounds represented by the formula (2), novolac-based cyanate esters represented by the formula (3), biphenyl aralkyl-based cyanate ester, bis(3,5-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl)thioether, bis(4-cyanatophenyl)sulfone, and 2,2'-bis(4-cyanatophenyl)propane.

Among them, a naphthol aralkyl-based cyanate ester compound represented by the formula (2), a novolac-based cyanate ester represented by the formula (3), and biphenyl aralkyl-based cyanate ester are preferred from the viewpoint of the flame retardance, curability, and low coefficient of thermal expansion of the resulting printed-wiring board.

Examples of the maleimide compound include, but are not particularly limited to, N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, and maleimide compounds represented by the formula (6), and prepolymers of these maleimide compounds, and prepolymers of these maleimide compounds and amine compounds. These maleimide compounds may be used singly or as a mixture of two or more.

Among them, bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the formula (6) are preferred, and in particular, a maleimide compound represented by the formula (6) is preferred.

The ratio of the maleimide compound in the BT resin (H) is not particularly limited and is preferably in the range from 5% by mass or more to 75% by mass or less, more preferably in the range from 10% by mass or more to 70% by mass or less, based on the total mass of the BT resin (H) from the viewpoint of glass transition temperature, flame retardance, and curability.

The molecular weight range of the BT resin (H) as a prepolymer is not particularly limited and is preferably the range from approximately 100 to approximately 100000 in terms of number-average molecular weight from the viewpoint of handleability, glass transition temperature, and curability.

In the case of using the BT resin (H) in the present embodiment, the content of the BT resin (H) in the thermosetting resin (C) is preferably from 20 parts by mass or more to 80 parts by mass or less, more preferably 30 parts by mass or more to 70 parts by mass or less, based on 100 parts by mass in total of the thermosetting resin (C) from the viewpoint of curability and heat resistance. When the content of the BT resin (H) is within the preferred range, the curing degree of the thermosetting resin can be further enhanced. Thus, a printed-wiring board excellent in flame retardance, glass transition temperature, the rate of water absorption, and the modulus of elasticity can be obtained.

Preferably, the resin composition of the present embodiment further contains an imidazole compound represented by the following formula (13). This imidazole compound has the effect of accelerating curability and also has the effect of further enhancing the glass transition temperature of a cured product.

(13)

In the above formula, each Ar independently represents a phenyl group, a naphthyl group, a biphenyl group, or an anthracenyl group, or a hydroxy group-modified product thereof and is preferably a phenyl group. $R_{15}$ represents a hydrogen atom, an alkyl group or a hydroxy group-modified product thereof, or an aryl group. The aryl group is preferably a phenyl group. More preferably, both of Ar and $R_{15}$ are phenyl groups.

In the case of using the imidazole compound in the present embodiment, the content of the imidazole compound in the thermosetting resin (C) is preferably from 0.01 parts by mass or more to 10 parts by mass or less, more preferably 0.1 to 5 parts by mass, based on 100 parts by mass in total of the thermosetting resin (C) from the viewpoint of curability and heat resistance. When the content of the imidazole compound is within the preferred range, the viscosity of a prepreg can be controlled within a more proper range and better moldability can be achieved. In addition, the resulting printed-wiring board has a higher degree of curing and is excellent in flame retardance, glass transition temperature, and the modulus of elasticity.

In the resin composition of the present embodiment, the imidazole compound may be used in combination with an additional curing accelerator without impairing desired characteristics. Examples of such a curing accelerator include: organic peroxides such as benzoyl peroxide, lauroyl peroxide, acetyl peroxide, p-chlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octanoate, tin oleate, dibutyl tin maleate, manganese naphthenate, cobalt naphthenate, and acetyl acetone iron; these organic metal salts dissolved in hydroxy group-containing compounds such as phenol and bisphenol; inorganic metal salts such as tin chloride, zinc chloride, and aluminum chloride; and dioctyl tin oxide and other organic tin compounds such as alkyl tin and alkyl tin oxide. These curing accelerators can be used singly or in combinations of two or more.

The resin composition of the present embodiment may further contain a solvent, if necessary. For example, use of an organic solvent can further reduce viscosity during the preparation of the resin composition and thus improves handleability while further enhancing the impregnation of glass cloth with the resin composition. The solvent is not particularly limited by its type as long as the solvent can dissolve a portion or the whole of the thermosetting resin (C). Specific examples thereof include, but are not particularly limited to: ketones such as acetone, methyl ethyl ketone, and methylcellosolve; aromatic hydrocarbons such as toluene and xylene; amides such as dimethylformamide; and propylene glycol methyl ether and its acetate. These solvents can be used singly or in combinations of two or more.

The resin composition according to the present embodiment can be prepared according to a conventional method and is not particularly limited by its preparation method as long as a resin composition uniformly containing the nanoparticles (A) having an average particle size from 1.0 nm or larger to 100 nm or smaller, the fine particles (B) having an average particle size from 0.20 µm or larger to 100 µm or smaller, and the thermosetting resin (C), and other optional components mentioned above can be obtained by the method. For example, the nanoparticles (A), the fine particles (B), and the thermosetting resin (C) can be added in the order presented to a solvent and thoroughly stirred to easily prepare the resin composition of the present embodiment. Preferably, the nanoparticles (A) are surface-treated with the polysiloxane-based modifier and then stirred, mixed, and kneaded with other components, from the viewpoint of further reducing the viscosity of a prepreg.

An organic solvent can be used, if necessary, in the preparation of the resin composition of the present embodiment. The organic solvent is not particularly limited by its type as long as the organic solvent can dissolve the thermosetting resin (C). Specific examples thereof are as listed above.

Known treatment (stirring, mixing, or kneading treatment, etc.) for uniformly dissolving or dispersing each component can be carried out in the preparation of the resin composition. For example, the fine particles (B) can be dispersed by stirring treatment using a stirring vessel equipped with a stirrer having an appropriate stirring ability. This further enhances the dispersibility of the fine particles (B) in the resin composition. The stirring, mixing, or kneading treatment can be appropriately performed using a known apparatus such as an apparatus aimed at mixing, for example, a ball mill or a bead mill, or a revolution and/or rotation-type mixing apparatus.

The prepreg of the present embodiment includes a substrate and the resin composition, the substrate being impregnated or coated with the resin composition. This prepreg can be obtained by impregnating or coating the substrate with the resin composition. The prepreg can be prepared according to a conventional method without particular limitations. For example, the substrate can be impregnated or coated with the resin composition of the present embodiment, followed by semi-curing (conversion into B-stage) by heating or the like for 1 to 30 minutes in a drier of 100 to 200° C. to prepare the prepreg of the present embodiment. The amount of the resin composition in the prepreg of the present embodiment is not particularly limited and is preferably in the range from 30% by mass or more to 90% by mass or less based on the total mass of the prepreg.

The substrate used in the present embodiment is not particularly limited and can be appropriately selected for use from various known printed-wiring board materials according to the intended use or performance. Specific examples thereof include, but are not particularly limited to: glass fibers such as E glass, D glass, S glass, Q glass, spherical glass, NE glass, and T glass; non-glass inorganic fibers such as quartz; wholly aromatic polyamides such as poly-p-phenyleneterephthalamide (Kevlar®, manufactured by Du Pont K.K.) and co-poly-paraphenylene/3,4'-oxydiphenylene terephthalamide (Technora®, manufactured by Teijin Techno Products, Ltd.); polyesters such as 2,6-hydroxynaphthoic acid/p-hydroxybenzoic acid (Vectran®, Kuraray Co., Ltd.); and organic fibers such as poly-p-phenylene benzoxazole (Zylon®, manufactured by Toyobo Co., Ltd.) and polyimide.

Among them, E glass, T glass, S glass, Q glass, and an organic fiber are preferred from the viewpoint of low thermal expansion.

These substrates can be used singly or in combinations of two or more.

For example, a woven fabric, an unwoven fabric, a roving, a chopped strand mat, and a surfacing mat are known as forms of the substrate, and plain weave, mat weave, and twill weave are known as textures of the woven fabric. The substrate can be appropriately selected for use from these known materials according to the intended use or performance. A glass woven fabric obtained by the opening treatment thereof or the surface treatment thereof with a silane coupling agent is preferably used. The substrate is not particularly limited by its thickness and mass. Usually, the substrate of approximately 0.01 to 0.3 mm is preferably used. In particular, the substrate is preferably a glass woven fabric having a thickness of 200 or smaller and a mass of 250 g/m² or smaller, more preferably a glass woven fabric made of E glass, S glass, or T glass fiber, from the viewpoint of strength and water absorbability.

The laminate of the present embodiment includes at least one prepreg described above. The laminate is not particularly limited as long as the laminate includes at least one prepreg. The laminate may further contain any layer. The laminate can be appropriately produced by use of a generally known method without particular limitations. For example, one prepreg or two or more prepregs can be laminated and then cured to obtain the laminate. More specifically, the prepregs can be laminated on each other and molded under heat and pressure to obtain the laminate. In this operation, the heating temperature is not particularly limited and is preferably 65 to 300° C., more preferably 120 to 270° C. The pressure to be applied is not particularly limited and is preferably 2 to 5 MPa, more preferably 2.5 to 4 MPa. The laminate of the present embodiment including a layer containing a metal foil can be suitably used as a metal foil-clad laminate mentioned later.

The metal foil-clad laminate of the present embodiment includes the prepreg described above and a metal foil laminated on the prepreg. This metal foil-clad laminate may include one or two or more prepregs described above and may include the metal foil disposed on one or both of the prepreg surfaces. Specifically, the metal foil-clad laminate of the present embodiment can be prepared by providing one or two or more prepregs described above, disposing the metal (e.g., copper or aluminum) foil on one or both of the surfaces as desired, and molding this construct by lamination according to the need. In this context, the metal foil used is not particularly limited as long as the metal foil can be used as a printed-wiring board material. A known copper foil such as a rolled copper foil or an electrolytic copper foil is preferred. The thickness of the metal foil is not particularly limited and is preferably 2 to 70 µm, more preferably 2 to 35 µm. The metal foil-clad laminate is not particularly limited by its molding method and molding conditions and can be molded by use of a general approach and conditions for laminates for printed-wiring boards and multilayer boards. For example, a multiplaten press, a multiplaten vacuum press, a continuous molding machine, or an autoclave molding machine can be used in the molding of the metal foil-clad laminate. The molding conditions generally involve a temperature of 100 to 300° C., a pressure of 2 to 100 kgf/cm² in terms of surface pressure, and a heating time in the range of 0.05 to 5 hours. If necessary, post curing may be further carried out at a temperature of 150 to 300° C. Alternatively, the prepreg of the present embodiment may be molded by lamination in combination with a separately prepared wiring board for an inner layer to obtain a multilayer board.

The metal foil-clad laminate of the present embodiment can be suitably used as a printed-wiring board by the formation of a predetermined wiring pattern. The metal foil-clad laminate of the present embodiment has a low coefficient of thermal expansion and favorable moldability and chemical resistance and can thus be used particularly effectively as a printed-wiring board for a semiconductor package required to have such performance.

The printed-wiring board of the present embodiment is a printed-wiring board including an insulating layer and a conductor layer formed on the surface of the insulating layer, the insulating layer including the resin composition described above. This printed-wiring board can be produced by, for example, the following method: first, a metal foil-clad laminate such as a copper-clad laminate is prepared. The surface of the metal foil-clad laminate is subjected to etching treatment for the formation of an inner layer circuit to prepare an inner layer plate. The inner layer circuit surface of this inner layer plate is subjected, if necessary, to surface treatment for enhancing adhesion strength. Subsequently, a required number of the prepreg of the present invention is laminated on the resulting inner layer circuit surface. A metal foil for an outer layer circuit is laterally laminated thereon, followed by integral molding under heat and pressure. In this way, a multilayer metal foil-clad laminate is produced in which the substrate and the insulating layer made of a cured product of the resin composition are formed between the inner layer circuit and the metal foil for an outer layer circuit. Subsequently, this multilayer metal foil-clad laminate is processed by hole drilling for through-holes or via holes and then subjected to desmear treatment for removing smear, which is a residue of resins derived from the resin components included in the insulating layer. Then, the inside walls of these holes are coated with a metal plating film for the continuity between the inner layer circuit and the metal foil for an outer layer circuit. The metal foil for an outer layer circuit is further subjected to etching treatment for the formation of the outer layer circuit to produce the printed-wiring board.

In this aspect, the prepreg of the present embodiment (the substrate impregnated or coated with the resin composition of the present embodiment) or the resin composition layer of the metal foil-clad laminate (the layer containing the resin composition of the present embodiment) constitutes the insulating layer including the resin composition.

The present embodiment can provide a resin composition for a prepreg that can be prepared easily and reproducibly into a cured product and is provided with a high level of characteristics such as low thermal expansion and high heat conductivity. The present embodiment can also offer favorable moldability of the metal foil-clad laminate and provide, for example, a prepreg, a laminate, and a printed-wiring board having favorable heat resistance and heat resistance after moisture absorption.

Hereinafter, the present invention will be described in detail with reference to Synthesis Examples, Examples, Comparative Preparation Examples, and Comparative Examples. However, the present invention is not intended to be limited by these Examples by any means.

EXAMPLES

Synthesis Example 1

Synthesis of Polysiloxane for Use in Surface Modification

To a reactor equipped with a heater, an internal thermometer, a stirrer, and a nitrogen gas supply port, polysiloxane having SiH functional groups represented by the following formula (14) was added and heated to 70° C. in the nitrogen gas atmosphere. To this reactor, 10 ppm of hexachloroplatinic(IV) acid was added as a catalyst. To the reactor, 251 g of allyl ether represented by the following formula (15) and 73 g of vinyltriethoxysilane were further added. This operation was carefully conducted such that the reaction temperature did not exceed 80° C. The resulting reaction solution was stirred at 80° C. for 1 hour. Then, unreacted vinyltrimethoxysilane and unreacted polysiloxane were removed in vacuum to obtain polysiloxane having an amber color.

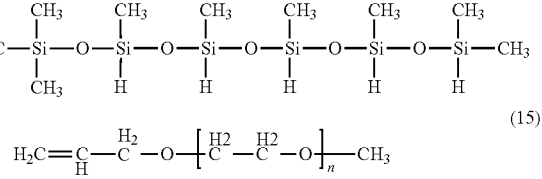

(14)

$$H_2C= \underset{H}{\overset{}{C}} - \overset{H_2}{C} - O - \left[ \overset{H2}{C} - \overset{H2}{C} - O \right]_n - CH_3$$

(15)

Synthesis Example 2

Preparation of Surface-Treated Nanoparticles

To 40 g of spherical nano-alumina [composition: delta-type:gamma-type=70:30 (mass ratio), average particle size (D50): 20 nm] produced by plasma gas-phase synthesis, 4 g of the polysiloxane synthesized in Synthesis Example 1 was added, and the mixture was stirred for 1 minute in a mixer and then heated at 80° C. for 1 hour. To this mixture, a mixed solution of 56.8 g of methoxypropyl acetate and 3.2 g of Disperbyk-180 (product name, manufactured by BYK Japan K.K.) as a wetting and dispersing agent containing phosphoric acid ester and alkylbenzenesulfonic acids was added. After stirring, the particles were dispersed by ultrasonication to obtain surface-treated nanoparticles.

Synthesis Example 3

Synthesis of α-Naphthol Aralkyl-Based Cyanate Ester Resin

A reactor equipped with a thermometer, a stirrer, a dropping funnel, and a reflux condenser was cooled in advance to 0 to 5° C. using brine and charged with 7.47 g (0.122 mol) of cyanogen chloride, 9.75 g (0.0935 mol) of 35% hydrochloric acid, 76 ml of water, and 44 ml of methylene chloride.

While the internal temperature of this reactor was kept at −5 to +5° C. and the pH was kept at 1 or lower, a solution containing 20 g (0.0935 mol) of α-naphthol aralkyl-based phenol resin (product name "SN485", OH group equivalent: 214 g/eq., softening point: 86° C., manufactured by Nippon Steel Chemical Co., Ltd.) and 14.16 g (0.14 mol) of triethylamine dissolved in 92 mL of methylene chloride was added dropwise through the dropping funnel over 1 hour with stirring. After the completion of the dropwise addition, 4.72 g (0.047 mol) of triethylamine was further added dropwise thereto over 15 minutes.

After the completion of the dropwise addition, the mixture was stirred at the same temperature as above for 15 minutes. Then, the reaction solution was separated into organic and aqueous layers. The organic layer was collected. The obtained organic layer was washed with 100 mL of water twice. Then, methylene chloride was distilled off under reduced pressure using an evaporator. The residue was finally evaporated to dryness at 80° C. for 1 hour to obtain 23.5 g of a cyanate ester form of the α-naphthol aralkyl-based phenol resin represented by the formula (2) wherein all $R_5$ moieties were hydrogen atoms (α-naphthol aralkyl-based cyanate ester resin).

Synthesis Example 4

Synthesis of BT Resin 1

36 parts by mass of the α-naphthol aralkyl-based cyanate ester resin (cyanate equivalent: 261 g/eq.) prepared in Synthesis Example 3 and 24 parts by mass of a maleimide compound represented by the formula (6) wherein all $R_9$ moieties were hydrogen atoms, and $n_5$ was 1 to 3 (product name "BMI-2300", manufactured by Daiwakasei Industry Co., Ltd.) were dissolved in dimethylacetamide and were reacted at 150° C. with stirring to obtain BT resin 1.

Synthesis Example 5

Synthesis of BT Resin 2

36 parts by mass of the α-naphthol aralkyl-based cyanate ester resin (cyanate equivalent: 261 g/eq.) prepared in Synthesis Example 3 and 26 parts by mass of bis(3-ethyl-5-methyl-maleimidophenyl)methane (product name "BMI-70", manufactured by K·I Chemical Industry Co., Ltd.) were dissolved in dimethylacetamide and were reacted at 150° C. with stirring to obtain BT resin 2.

Example 1

1 part by mass of alumina nanoparticles surface-treated with a polysiloxane-based modifier (product name "NANOBYK-3610", average particle size: 20 nm, manufactured by BYK Japan K.K.), 300 parts by mass of spherical fused silica (product name "FB-3SDC", average particle size: 3.0 μm, manufactured by Denki Kagaku Kogyo K.K.), 100 parts by mass of spherical fused silica (product name "SFP-120MC", average particle size: 0.30 μm, manufactured by Denki Kagaku Kogyo K.K.), 40 parts by mass of the α-naphthol aralkyl-based cyanate ester resin obtained in Synthesis Example 3 (cyanate equivalent: 261 g/eq.), 60 parts by mass of polyoxynaphthylene-based epoxy resin (product name "HP-6000", epoxy equivalent: 250 g/eq., manufactured by DIC Corp.), 1 part by mass of wetting and dispersing agent 1 (product name "Disperbyk-161", manufactured by BYK Japan K.K.), 2 parts by mass of wetting and dispersing agent 2 (product name "Disperbyk-111", manufactured by BYK Japan K.K.), and 5 parts by mass of a silane coupling agent (product name "Z6040", manufactured by Dow Corning Toray Co., Ltd.) were mixed to obtain varnish. This varnish was diluted with methyl ethyl ketone. An E glass woven fabric having a thickness of 0.1 mm was impregnated and coated with the dilution and dried by heating at 140° C. for 3 minutes to obtain a prepreg having a resin content of 63% by mass.

Example 2

A prepreg was obtained in the same way as in Example 1 except that 40 parts by mass of a prepolymer of 2,2-bis(4-cyanatophenyl)propane (product name "CA210", cyanate equivalent: 139, manufactured by Mitsubishi Gas Chemical Co., Inc.) were used instead of the α-naphthol aralkyl-based cyanate ester resin.

Example 3

A prepreg was obtained in the same way as in Example 1 except that 40 parts by mass of novolac-based cyanate ester resin represented by the formula (3) wherein all $R_6$ moieties were hydrogen atoms (product name "Primaset PT-30", manufactured by Lonza Japan Ltd, cyanate equivalent: 124 g/eq.) were used instead of the α-naphthol aralkyl-based cyanate ester resin.

Example 4

1 part by mass of alumina nanoparticles surface-treated with a polysiloxane-based modifier (product name "NANOBYK-3610", average particle size: 20 nm, manufactured by BYK Japan K.K.), 300 parts by mass of spherical fused silica (product name "FB-3SDC", average particle size: 3.0 μm, manufactured by Denki Kagaku Kogyo K.K.), 100 parts by mass of spherical fused silica (SFP-120MC, average particle size: 0.3 μm, manufactured by Denki Kagaku Kogyo K.K.), 36 parts by mass of the α-naphthol aralkyl-based cyanate ester resin obtained in Synthesis Example 3 (cyanate equivalent: 261 g/eq.), 26 parts by mass of the maleimide compound used in Synthesis Example 4 (product name "BMI-2300"), 38 parts by mass of polyoxynaphthylene-based epoxy resin (product name "HP-6000", epoxy equivalent: 250 g/eq., manufactured by DIC Corp.), 1 part by mass of wetting and dispersing agent 1 (product name "Disperbyk-161", manufactured by BYK Japan K.K.), 2 parts by mass of wetting and dispersing agent 2 (product name "Disperbyk-111", manufactured by BYK Japan K.K.), 5 parts by mass of a silane coupling agent (product name "Z6040", manufactured by Dow Corning Toray Co., Ltd.), and 1 part by mass of 2,4,5-triphenylimidazole (manufactured by Wako Pure Chemical Industries, Ltd.) were mixed to obtain varnish. This varnish was diluted with methyl ethyl ketone. An E glass woven fabric having a thickness of 0.1 mm was impregnated and coated with the dilution and dried by heating at 140° C. for 3 minutes to obtain a prepreg having a resin content of 63% by mass.

Example 5

A prepreg was obtained in the same way as in Example 4 except that the usage amount of the alumina nanoparticles surface-treated with a polysiloxane-based modifier (product name "NANOBYK-3610") was changed from 1 part by mass to 3 parts by mass.

Example 6

A prepreg was obtained in the same way as in Example 4 except that the usage amount of the alumina nanoparticles surface-treated with a polysiloxane-based modifier (product name "NANOBYK-3610") was changed from 1 part by mass to 5 parts by mass.

Example 7

A prepreg was obtained in the same way as in Example 4 except that 26 parts by mass of the maleimide compound used in Synthesis Example 5 (product name "BMI-70") were used instead of the maleimide compound (product name "BMI-2300").

Example 8

A prepreg was obtained in the same way as in Example 4 except that 38 parts by mass of phenol biphenyl aralkyl-based epoxy resin represented by the formula (8) wherein all $R_{11}$ moieties were hydrogen atoms (product name "NC-3000-FH", epoxy equivalent: 320 g/eq., manufactured by Nippon Kayaku Co., Ltd.) were used instead of the polyoxynaphthylene-based epoxy resin (product name "HP-6000").

Example 9

A prepreg was obtained in the same way as in Example 4 except that 38 parts by mass of naphthol aralkyl-based epoxy resin (product name "ESN-175V", epoxy equivalent: 255 g/eq., manufactured by Nippon Steel Chemical Co., Ltd.) were used instead of the polyoxynaphthylene-based epoxy resin (product name "HP-6000").

Example 10

A prepreg was obtained in the same way as in Example 4 except that 38 parts by mass of phenol phenyl aralkyl-based epoxy resin represented by the formula (7) wherein all $R_{10}$ moieties were hydrogen atoms (product name "NC-2000-L", epoxy equivalent: 226 g/eq., manufactured by Nippon Kayaku Co., Ltd.) were used instead of the polyoxynaphthylene-based epoxy resin (product name "HP-6000").

Example 11

A prepreg was obtained in the same way as in Example 4 except that in obtaining the varnish, 0.01 parts by mass of 2-ethyl-4-methylimidazole (product name "2E4MZ", manufactured by Shikoku Chemicals Corp.) were further added.

Example 12

A prepreg was obtained in the same way as in Example 4 except that in obtaining the varnish: the α-naphthol aralkyl-based cyanate ester resin obtained in Synthesis Example 3 and the maleimide compound used in Synthesis Example 4 were not used; and 62 parts by mass of the BT resin 1 obtained in Synthesis Example 4 were added.

Example 13

A prepreg was obtained in the same way as in Example 4 except that in obtaining the varnish: the α-naphthol aralkyl-based cyanate ester resin obtained in Synthesis Example 3 and the maleimide compound used in Synthesis Example 4 were not used; and 62 parts by mass of the BT resin 2 obtained in Synthesis Example 5 were added.

Example 14

A prepreg was obtained in the same way as in Example 4 except that in obtaining the varnish: the α-naphthol aralkyl-based cyanate ester resin obtained in Synthesis Example 3 and the maleimide compound used in Synthesis Example 4 were not used; 59 parts by mass of the BT resin 1 obtained in Synthesis Example 4 and 3 parts by mass of naphthol aralkyl-based phenol resin represented by the formula (4) wherein all $R_7$ moieties were hydrogen atoms (product "SN-495", manufactured by Nippon Steel Chemical Co., Ltd., hydroxy group equivalent: 236 g/eq.) were added.

Example 15

A prepreg having a resin content of 64% by mass was obtained in the same way as in Example 4 except that in obtaining the varnish: the usage amount of the spherical fused silica (product name "FB-3SDC") was changed from 300 parts by mass to 150 parts by mass; the usage amount of the spherical fused silica (product name "SFP-120MC") was changed from 100 parts by mass to 150 parts by mass; 2 parts by mass of wetting and dispersing agent 3 (product name "Disperbyk-w903", manufactured by BYK Japan K.K.) were added instead of the wetting and dispersing agent 2 (product name "Disperbyk-111"); and 200 parts by mass of fine alumina particles (product name "AX3-15", average particle size: 3.0 manufactured by Nippon Steel & Sumikin Materials Co., Ltd. Micron Co.) were further added.

Example 16

A prepreg having a resin content of 69% by mass was obtained in the same way as in Example 4 except that in obtaining the varnish: the spherical fused silica (product name "FB-3SDC") and the spherical fused silica (product name "SFP-120MC") were not used; 5 parts by mass of wetting and dispersing agent 3 (product name "Disperbyk-w903") were added instead of the wetting and dispersing agent 1 (product name "Disperbyk-161") and the wetting and dispersing agent 2 (product name "Disperbyk-111"); and 400 parts by mass of fine alumina particles (product name "AX3-15", average particle size: 3.0 manufactured by Nippon Steel & Sumikin Materials Co., Ltd. Micron Co.) were further added.

Example 17

A prepreg having a resin content of 66% by mass was obtained in the same way as in Example 4 except that in obtaining the varnish: the spherical fused silica (product name "FB-3SDC") and the spherical fused silica (product name "SFP-120MC") were not used; 5 parts by mass of wetting and dispersing agent 3 (product name "Disperbyk-w903") were added instead of the wetting and dispersing agent 1 (product name "Disperbyk-161") and the wetting and dispersing agent 2 (product name "Disperbyk-111"); and 100 parts by mass of fine alumina particles (product name "ASEP-20", average particle size: 0.3 µm, manufactured by Denki Kagaku Kogyo K.K.) and 300 parts by mass of fine boehmite particles (product name "BM5009", average particle size: 3.0 µm, manufactured by Admatechs Co., Ltd.) were further added.

Example 18

A prepreg having a resin content of 60% by mass was obtained in the same way as in Example 4 except that in obtaining the varnish, 10 parts by mass of a silicone rubber powder surface-coated with a silicone resin (hybrid silicone powder, product name "KMP-600", manufactured by Shin-Etsu Chemical Co., Ltd.) were further added.

Example 19

1 part by mass of the alumina nanoparticles surface-treated with a polysiloxane-based modifier used in Example 1 (product name "NANOBYK-3610"), 300 parts by mass of spherical fused silica (product name "FB-3SDC", average particle size: 3.0 µm, manufactured by Denki Kagaku Kogyo K.K.), 100 parts by mass of spherical fused silica (product name "SFP-120MC", average particle size: 0.3 µm, manufactured by Denki Kagaku Kogyo K.K.), 49 parts by mass of the phenol biphenyl aralkyl-based epoxy resin used in Example 8 (product name "NC-3000-FH"), 36 parts by mass of the naphthol aralkyl-based phenol resin used in Example 14 (product name "SN-495"), 15 parts by mass of bis(3-ethyl-5-methyl-4-maleimidophenyl)methane (product name "BMI-70"), 1 part by mass of wetting and dispersing agent 1 (product name "Disperbyk-161", manufactured by BYK Japan K.K.), 2 parts by mass of wetting and dispersing agent 2 (product name "Disperbyk-111", manufactured by BYK Japan K.K.), 5 parts by mass of a silane coupling agent (product name "Z6040", manufactured by Dow Corning Toray Co., Ltd.), and 0.02 parts by mass of 2-ethyl-4-methylimidazole (product name "2E4MZ", manufactured by Shikoku Chemicals Corp.) were mixed to obtain varnish. This varnish was diluted with methyl ethyl ketone. An E glass woven fabric having a thickness of 0.1 mm was impregnated and coated with the dilution and dried by heating at 140° C. for 3 minutes to obtain a prepreg having a resin content of 63% by mass.

Example 20

1 part by mass of the alumina nanoparticles surface-treated with a polysiloxane-based modifier used in Example 1 (product name "NANOBYK-3610"), 300 parts by mass of spherical fused silica (product name "FB-3SDC", average particle size: 3.0 µm, manufactured by Denki Kagaku Kogyo K.K.), 100 parts by mass of spherical fused silica (product name "SFP-120MC", average particle size: 0.3 µm, manufactured by Denki Kagaku Kogyo K.K.), 44 parts by mass of polyoxynaphthylene-based epoxy resin (product name "HP-6000"), 18 parts by mass of biphenyl aralkyl-based phenol resin represented by the formula (5) wherein all $R_8$ moieties were hydrogen atoms (product name "KAYA-HARD GPH-103", manufactured by Nippon Kayaku Co., Ltd., hydroxy group equivalent: 231 g/eq.), 18 parts by mass of naphthalene-based phenol resin (product name "EPICLON EXB-9500", manufactured by DIC Corp., hydroxy group equivalent: 153 g/eq.), 3 parts by mass of aminotriazine novolac resin (product name "PHENOLITE LA-3018-50P", hydroxy group equivalent: 151 g/eq., manufactured by DIC Corp.), 17 parts by mass of bis(3-ethyl-5-methyl-4-maleimidophenyl)methane (product name "BMI-70"), 1 part by mass of wetting and dispersing agent 1 (product name "Disperbyk-161"), 2 parts by mass of wetting and dispersing agent 2 (product name "Disperbyk-111"), 5 parts by mass of a silane coupling agent (product name "Z6040", manufactured by Dow Corning Toray Co., Ltd.), and 0.02 parts by mass of 2-ethyl-4-methylimidazole (product name "2E4MZ", manufactured by Shikoku Chemicals Corp.) were mixed to obtain varnish. This varnish was diluted with methyl ethyl ketone. An E glass woven fabric having a thickness of 0.1 mm was impregnated and coated with the dilution and dried by heating at 140° C. for 3 minutes to obtain a prepreg having a resin content of 63% by mass.

Example 21

A prepreg was obtained in the same way as in Example 20 except that 17 parts by mass of the maleimide compound used in Synthesis Example 4 (product name "BMI-2300") were used instead of the bis(3-ethyl-5-methyl-4-maleimidophenyl)methane (BMI-70).

Example 22

An S glass woven fabric having a thickness of 0.1 mm was impregnated and coated with the varnish prepared in Example 1 and dried by heating at 140° C. for 3 minutes to obtain a prepreg having a resin content of 61% by mass.

Example 23

An S glass woven fabric having a thickness of 0.1 mm was impregnated and coated with the varnish prepared in

Example 4 and dried by heating at 140° C. for 3 minutes to obtain a prepreg having a resin content of 61% by mass.

Example 24

An S glass woven fabric having a thickness of 0.1 mm was impregnated and coated with the varnish prepared in Example 7 and dried by heating at 140° C. for 3 minutes to obtain a prepreg having a resin content of 61% by mass.

Example 25

An S glass woven fabric having a thickness of 0.1 mm was impregnated and coated with the varnish prepared in Example 12 and dried by heating at 140° C. for 3 minutes to obtain a prepreg having a resin content of 61% by mass.

Example 26

A prepreg was obtained in the same way as in Example 1 except that the surface-treated nanoparticles prepared in Synthesis Example 2 were used instead of the alumina nanoparticles surface-treated with a polysiloxane-based modifier (product name "NANOBYK-3610", average particle size: 20 nm, manufactured by BYK Japan K.K.).

Example 27

A prepreg was obtained in the same way as in Example 4 except that the surface-treated nanoparticles prepared in Synthesis Example 2 were used instead of the alumina nanoparticles surface-treated with a polysiloxane-based modifier (product name "NANOBYK-3610", average particle size: 20 nm, manufactured by BYK Japan K.K.).

Example 28

A prepreg was obtained in the same way as in Example 12 except that the surface-treated nanoparticles prepared in Synthesis Example 2 were used instead of the alumina nanoparticles surface-treated with a polysiloxane-based modifier (product name "NANOBYK-3610", average particle size: 20 nm, manufactured by BYK Japan K.K.).

Example 29

A prepreg was obtained in the same way as in Example 19 except that the surface-treated nanoparticles prepared in Synthesis Example 2 were used instead of the alumina nanoparticles surface-treated with a polysiloxane-based modifier (product name "NANOBYK-3610", average particle size: 20 nm, manufactured by BYK Japan K.K.).

Example 30

A prepreg was obtained in the same way as in Example 4 except that boehmite nanoparticles surface-treated with a polysiloxane-based modifier (product name "LP-X-21121", average particle size: 10 nm, manufactured by BYK Japan K.K.) were used instead of the alumina nanoparticles surface-treated with a polysiloxane-based modifier (product name "NANOBYK-3610", average particle size: 20 nm, manufactured by BYK Japan K.K.).

Comparative Example 1

A prepreg was obtained in the same way as in Example 1 except that the alumina nanoparticles surface-treated with a polysiloxane-based modifier (product name "NANOBYK-3610") were not used.

Comparative Example 2

A prepreg was obtained in the same way as in Example 4 except that the alumina nanoparticles surface-treated with a polysiloxane-based modifier (product name "NANOBYK-3610") were not used.

Comparative Example 3

A prepreg was obtained in the same way as in Example 8 except that the alumina nanoparticles surface-treated with a polysiloxane-based modifier (product name "NANOBYK-3610") were not used.

Comparative Example 4

A prepreg was obtained in the same way as in Example 12 except that the alumina nanoparticles surface-treated with a polysiloxane-based modifier (product name "NANOBYK-3610") were not used.

Comparative Example 5

A prepreg was obtained in the same way as in Example 15 except that the alumina nanoparticles surface-treated with a polysiloxane-based modifier (product name "NANOBYK-3610") were not used.

Comparative Example 6

A prepreg was obtained in the same way as in Example 16 except that the alumina nanoparticles surface-treated with a polysiloxane-based modifier (product name "NANOBYK-3610") were not used.

Comparative Example 7

A prepreg was obtained in the same way as in Example 17 except that the alumina nanoparticles surface-treated with a polysiloxane-based modifier (product name "NANOBYK-3610") were not used.

Comparative Example 8

A prepreg was obtained in the same way as in Example 20 except that the alumina nanoparticles surface-treated with a polysiloxane-based modifier (product name "NANOBYK-3610") were not used.

Comparative Example 9

A prepreg was obtained in the same way as in Example 4 except that 1 part by mass of silica nanoparticles (product name "NANOBYK-3652", average particle size: 20 nm, manufactured by BYK Japan K.K.) was used instead of the alumina nanoparticles surface-treated with a polysiloxane-based modifier (product name "NANOBYK-3610").

Comparative Example 10

A prepreg was obtained in the same way as in Example 22 except that: the alumina nanoparticles surface-treated with a polysiloxane-based modifier (product name "NANOBYK-3610") were not used; and the usage amount of the spherical fused silica (product name "FB-3SDC", average particle size: 3.0 μm, manufactured by Denki Kagaku Kogyo K.K.) was changed from 300 parts by mass to 200 parts by mass.

Comparative Example 11

A prepreg was obtained in the same way as in Example 23 except that: the alumina nanoparticles surface-treated with a polysiloxane-based modifier (product name "NANOBYK-3610") were not used; and the usage amount of the spherical fused silica (product name "FB-3SDC", average particle size: 3.0 μm, manufactured by Denki Kagaku Kogyo K.K.) was changed from 300 parts by mass to 200 parts by mass.

Comparative Example 12

A prepreg was obtained in the same way as in Example 24 except that: the alumina nanoparticles surface-treated with a polysiloxane-based modifier (product name "NANOBYK-3610") were not used; and the usage amount of the spherical fused silica (product name "FB-3SDC", average particle size: 3.0 μm, manufactured by Denki Kagaku Kogyo K.K.) was changed from 300 parts by mass to 200 parts by mass.

Comparative Example 13

A prepreg was obtained in the same way as in Example 25 except that: the alumina nanoparticles surface-treated with a polysiloxane-based modifier (product name "NANOBYK-3610") were not used; and the usage amount of the spherical fused silica (product name "FB-3SDC", average particle size: 3.0 μm, manufactured by Denki Kagaku Kogyo K.K.) was changed from 300 parts by mass to 200 parts by mass.

Comparative Example 14

A prepreg was obtained in the same way as in Example 1 except that methyl ethyl ketone slurry containing 5% by mass of untreated alumina nanoparticles (average particle size (D50): 20 nm) dispersed for 5 minutes using an ultrasonic dispersing machine (product name "UP200S", manufactured by Hielscher Ultrasonics GmbH) were added instead of the alumina nanoparticles surface-treated with a polysiloxane-based modifier (product name "NANOBYK-3610").

[Preparation of Metal Foil-Clad Laminate]

Electrolytic copper foils having a thickness of 12 μm (3EC-III, manufactured by Mitsui Mining & Smelting Co., Ltd.) were disposed on both surfaces of one prepreg obtained in any of Examples 1 to 30 and Comparative Examples 1 to 14 so as to sandwich the prepreg, and laminated and molded at a pressure of 30 kgf/cm² at a temperature of 220° C. for 120 minutes to obtain a copper-clad laminate having an insulating layer thickness of 0.14 mm.

Results of measuring the melt viscosity of each obtained prepreg and results of evaluating moldability, heat resistance, and heat resistance after moisture absorption using each obtained copper-clad laminate are shown in Tables 1 and 2.

[Method for Evaluating Each Physical Property]

Each prepreg was evaluated for its melt viscosity (prepreg viscosity: unit: ×16 Pa·s), moldability, heat resistance, heat resistance after moisture absorption, coefficient of thermal expansion, and coefficient of heat conductivity by the following methods:

Prepreg viscosity: the melt viscosity was measured at 120° C. using a flow tester (manufactured by Shimadzu Corp.).

Moldability: after removal of the copper foils from each copper-clad laminate by etching, the exposed surfaces were visually observed to evaluate the presence or absence of voids. A sample confirmed to have no void was evaluated as ○, whereas a sample confirmed to have voids was evaluated as ×.

Heat resistance: a sample of 50×50 mm was floated in solder of 280° C. for 30 minutes. The presence or absence of delamination was confirmed by visual observation and evaluated according to the following criteria:

○: Not abnormal, ×: Delamination occurred during the floating from 0 to 30 minutes.

Heat resistance after moisture absorption: the copper foils were removed by etching from regions other than half of one surface of a sample of 50 mm×50 mm to prepare a test piece (i.e., a test piece in which the copper foil remained only in half of one surface), which was then treated for 3 hours under conditions of 121° C. and 2 atm using a pressure cooker tester (manufactured by Hirayama Manufacturing Corp., model PC-3) and then dipped in solder of 260° C. for 30 seconds. Then, change in appearance was visually observed. This test was conducted four times to evaluate the number of occurrences of swelling (the number of occurrences of swelling/the number of test rounds).

Coefficient of thermal expansion: after removal of the copper foils from each copper foil-clad laminate by etching, the resulting sample was placed at a predetermined position of a thermomechanical analysis apparatus (manufactured by TA Instruments) and heated from 40° C. to 340° C. at a rate of 10° C./min to measure the linear coefficient of expansion in the planar direction at from 60° C. to 120° C. The direction of the measurement was set to the longitudinal direction (Warp) of the glass cloth of the laminate.

Coefficient of heat conductivity: the density of each obtained copper foil-clad laminate was measured. Also, the specific heat was measured using DSC (manufactured by TA Instruments, model Q100). Further, the thermal diffusivity was measured using a xenon flash analyzer (manufactured by Bruker Corp., product name "LFA447Nanoflash"). Then, the coefficient of heat conductivity was calculated according to the following expression:

Coefficient of heat conductivity (W/m·K)=Density (kg/m³)×Specific heat (kJ/kg·K)×Thermal diffusivity (m²/S)×1000

TABLE 1

|  | Example | | | | | | | |
|---|---|---|---|---|---|---|---|---|
|  | 1 | 2 | 3 | 4 | 5 | 6 | 7 | 8 |
| Prepreg viscosity | 800 | 700 | 900 | 900 | 880 | 890 | 850 | 920 |
| Moldability | ○ | ○ | ○ | ○ | ○ | ○ | ○ | ○ |
| Heat resistance | ○ | ○ | ○ | ○ | ○ | ○ | ○ | ○ |
| Heat resistance after moisture absorption | 0/4 | 0/4 | 0/4 | 0/4 | 0/4 | 0/4 | 0/4 | 0/4 |
| Coefficient of thermal expansion | 4.5 | 4.5 | 4.5 | 4.5 | 4.5 | 4.5 | 4.5 | 4.5 |
| Coefficient of heat conductivity | 0.8 | 0.8 | 0.8 | 0.8 | 0.8 | 0.8 | 0.8 | 0.8 |

|  | Example | | | | | | | |
|---|---|---|---|---|---|---|---|---|
|  | 9 | 10 | 11 | 12 | 13 | 14 | 15 | 16 |
| Prepreg viscosity | 750 | 800 | 850 | 920 | 880 | 950 | 800 | 800 |

TABLE 1-continued

| Moldability | ○ | ○ | ○ | ○ | ○ | ○ | ○ | ○ |
|---|---|---|---|---|---|---|---|---|
| Heat resistance | ○ | ○ | ○ | ○ | ○ | ○ | ○ | ○ |
| Heat resistance after moisture absorption | 0/4 | 0/4 | 0/4 | 0/4 | 0/4 | 0/4 | 0/4 | 0/4 |
| Coefficient of thermal expansion | 4.5 | 4.5 | 4.5 | 4.5 | 4.5 | 4.5 | 6 | 9.5 |
| Coefficient of heat conductivity | 0.8 | 0.8 | 0.8 | 0.8 | 0.8 | 0.8 | 1.3 | 3 |

|  | Example | | | | | | | |
|---|---|---|---|---|---|---|---|---|
|  | 17 | 18 | 19 | 20 | 21 | 22 | 23 | 24 |
| Prepreg viscosity | 900 | 950 | 850 | 920 | 980 | 980 | 980 | 980 |
| Moldability | ○ | ○ | ○ | ○ | ○ | ○ | ○ | ○ |
| Heat resistance | ○ | ○ | ○ | ○ | ○ | ○ | ○ | ○ |

TABLE 1-continued

| Heat resistance after moisture absorption | 0/4 | 0/4 | 0/4 | 0/4 | 0/4 | 0/4 | 0/4 | 0/4 |
|---|---|---|---|---|---|---|---|---|
| Coefficient of thermal expansion | 12.5 | 4.5 | 4.5 | 4.5 | 4.5 | 2.4 | 2.4 | 2.4 |
| Coefficient of heat conductivity | 2 | 0.8 | 0.8 | 0.8 | 0.8 | 0.8 | 0.8 | 0.8 |

|  | Example | | | | | |
|---|---|---|---|---|---|---|
|  | 25 | 26 | 27 | 28 | 29 | 30 |
| Prepreg viscosity | 900 | 800 | 900 | 920 | 850 | 600 |
| Moldability | ○ | ○ | ○ | ○ | ○ | ○ |
| Heat resistance | ○ | ○ | ○ | ○ | ○ | ○ |
| Heat resistance after moisture absorption | 0/4 | 0/4 | 0/4 | 0/4 | 0/4 | 0/4 |
| Coefficient of thermal expansion | 2.4 | 4.5 | 4.5 | 4.5 | 4.5 | 4.5 |
| Coefficient of heat conductivity | 0.8 | 0.8 | 0.8 | 0.8 | 0.8 | 0.8 |

TABLE 2

|  | Comparative Example | | | | | | | |
|---|---|---|---|---|---|---|---|---|
|  | 1 | 2 | 3 | 4 | 5 | 6 | 7 | 8 |
| Prepreg viscosity | 1900 | 2000 | 1950 | 1950 | 1800 | 2200 | 2500 | 2400 |
| Moldability | x | x | x | x | x | x | x | x |
| Heat resistance | x | x | x | x | x | x | x | x |
| Heat resistance after moisture absorption | 4/4 | 4/4 | 4/4 | 4/4 | 4/4 | 4/4 | 4/4 | 4/4 |
| Coefficient of thermal expansion | 4.5 | 4.5 | 4.5 | 4.5 | 4.5 | 4.5 | 4.5 | 4.5 |
| Coefficient of heat conductivity | 0.8 | 0.8 | 0.8 | 0.8 | 0.8 | 0.8 | 0.8 | 0.8 |

|  | Comparative Example | | | | | |
|---|---|---|---|---|---|---|
|  | 9 | 10 | 11 | 12 | 13 | 14 |
| Prepreg viscosity | 2700 | 900 | 950 | 930 | 900 | 10000 |
| Moldability | x | ○ | ○ | ○ | ○ | x |
| Heat resistance | x | ○ | ○ | ○ | ○ | x |
| Heat resistance after moisture absorption | 4/4 | 0/4 | 0/4 | 0/4 | 0/4 | 0/4 |
| Coefficient of thermal expansion | 4.5 | 3.5 | 3.5 | 3.5 | 3.5 | 4.5 |
| Coefficient of heat conductivity | 0.8 | 0.8 | 0.8 | 0.8 | 0.8 | 0.8 |

The present application is based on the Japanese patent application filed on Jan. 15, 2013 (Japanese Patent Application No. 2013-004411) and the Japanese patent application filed on Oct. 21, 2013 (Japanese Patent Application No. 2013-217997), the contents of which are incorporated herein by reference in their entirety.

INDUSTRIAL APPLICABILITY

The present invention provides a resin composition from which a prepreg having low viscosity convenient for the preparation of a metal foil-clad laminate can be prepared and also permits preparation of a metal foil-clad laminate excellent in heat resistance after moisture absorption, and provides a prepreg, a laminate, and a printed-wiring board prepared using the resin composition. Thus, the present invention is industrially applicable in such fields.

The invention claimed is:

1. A resin composition comprising: nanoparticles (A) of alumina and/or boehmite having an average particle size from 1.0 nm or more to 100 nm or less; particles (B) having an average particle size from 0.20 μm or more to 100 μm or less; and a thermosetting resin (C), wherein the nanoparticles (A) have their surfaces treated with a polysiloxane-based modifier, wherein the resin composition comprises more than 200 parts by mass of the particles (B) based on 100 parts by mass of the thermosetting resin (C).

2. The resin composition according to claim 1, wherein the nanoparticles (A) are treated with one or more dispersing agents selected from the group consisting of phosphoric acid ester, phosphoric acid ester salt, and alkylbenzenesulfonic acid.

3. The resin composition according to claim 1, wherein the resin composition comprises 250 parts by mass or more of the particles (B) based on 100 parts by mass of the thermosetting resin (C).

4. The resin composition according to claim 1, wherein the particles (B) are one or more selected from the group consisting of silica, alumina, aluminum nitride, boron nitride, boehmite, titanium oxide, silicone rubber, and hybrid silicone powder.

5. The resin composition according to claim 1, wherein the nanoparticles (A) are dispersed as primary particles in a solvent or a resin.

6. The resin composition according to claim 1, wherein the thermosetting resin (C) is one or more selected from the group consisting of a cyanate ester compound (D), a phenol resin (E), a maleimide compound (F), an epoxy resin (G), and a bismaleimide-triazine resin (H).

7. The resin composition according to claim 6, wherein the cyanate ester compound (D) is a compound represented by the following formula (2) and/or the following formula (3):

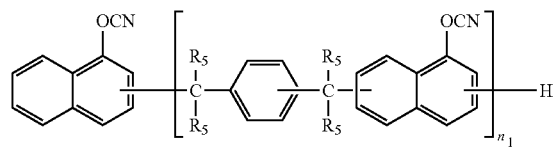

(2)

wherein each $R_5$ independently represents a hydrogen atom or a methyl group, and $n_1$ represents an integer of 1 or larger; and

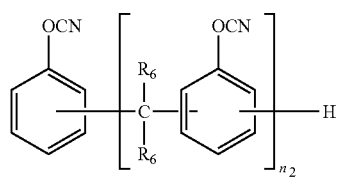

(3)

wherein each $R_6$ independently represents a hydrogen atom or a methyl group, and $n_2$ represents an integer of 1 or larger.

8. The resin composition according to claim 6, wherein the maleimide compound (F) is one or more selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following formula (6):

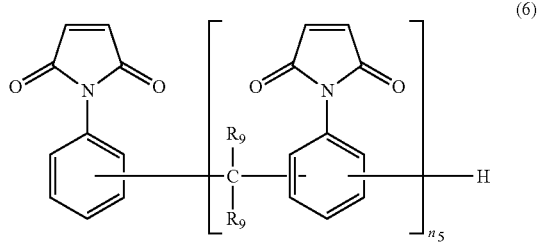

(6)

wherein each $R_9$ independently represents a hydrogen atom or a methyl group, and $n_5$ represents an integer of 1 or larger.

9. The resin composition according to claim 6, wherein the epoxy resin (G) is one or more selected from the group consisting of compounds represented by the following formulas (7), (8), (9), (11), and (12):

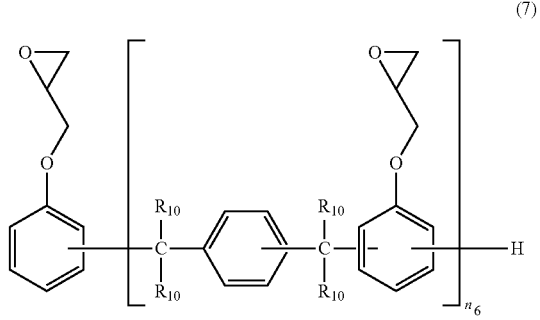

(7)

wherein each $R_{10}$ independently represents a hydrogen atom or a methyl group, and $n_6$ represents an integer of 1 or larger;

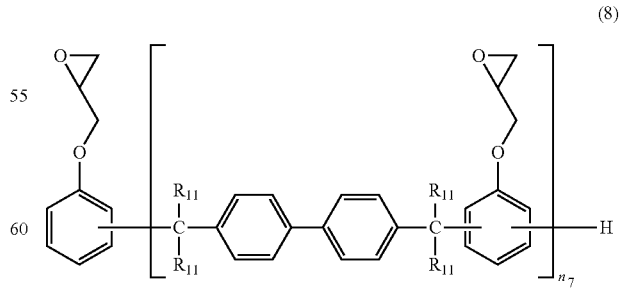

(8)

wherein each $R_{11}$ independently represents a hydrogen atom or a methyl group, and $n_7$ represents an integer of 1 or larger;

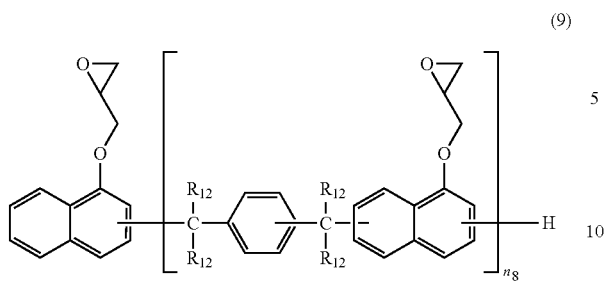

(9)

wherein each $R_{12}$ independently represents a hydrogen atom or a methyl group, and $n_8$ represents an integer of 1 or larger;

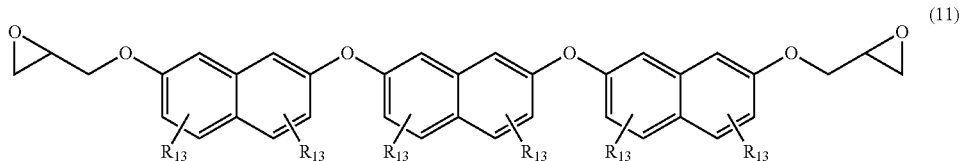

(11)

wherein each $R_{13}$ independently represents a hydrogen atom or a methyl group; and

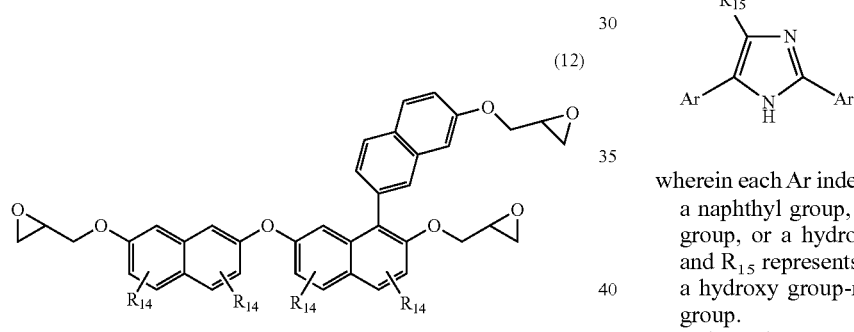

(12)

wherein each $R_{14}$ independently represents a hydrogen atom, an alkyl group having 1 to 4 carbon atoms, or an aralkyl group containing an alkyl moiety having 1 to 4 carbon atoms.

10. The resin composition according to claim 6, wherein the phenol resin (E) is one or more selected from the group consisting of a cresol novolac-based phenol resin, an aminotriazine novolac-based phenol resin, a naphthalene-based phenol resin, a naphthol aralkyl-based phenol resin represented by the following formula (4), and a biphenyl aralkyl-based phenol resin represented by the following formula (5):

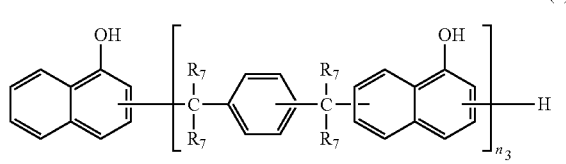

(4)

wherein each $R_7$ independently represents a hydrogen atom or a methyl group, and $n_3$ represents an integer of 1 or larger; and

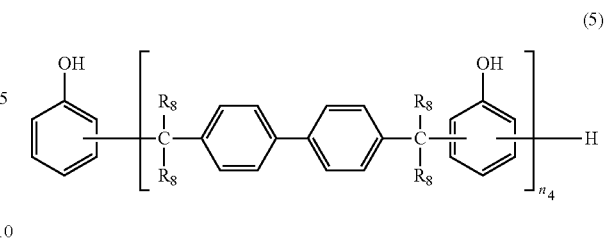

(5)

wherein each $R_8$ independently represents a hydrogen atom or a methyl group, and $n_4$ represents an integer of 1 or larger.

11. The resin composition according to claim 1, further comprising an imidazole compound represented by the following formula (13):

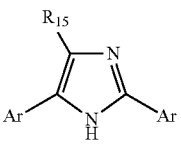

(13)

wherein each Ar independently represents a phenyl group, a naphthyl group, a biphenyl group, or an anthracenyl group, or a hydroxy group-modified product thereof, and $R_{15}$ represents a hydrogen atom, an alkyl group or a hydroxy group-modified product thereof, or an aryl group.

12. The resin composition according to claim 1, wherein the resin composition comprises from 0.010% by mass or more to 5% by mass or less of the alumina nanoparticles (A) based on the total mass of the particles (B).

13. The resin composition according to claim 6, wherein the thermosetting resin (C) comprises from 10 parts by mass or more to 60 parts by mass or less of the cyanate ester compound (D) based on 100 parts by mass in total of the thermosetting resin (C).

14. The resin composition according to claim 6, wherein the thermosetting resin (C) comprises from 10 parts by mass or more to 60 parts by mass or less of the phenol resin (E) based on 100 parts by mass in total of the thermosetting resin (C).

15. The resin composition according to claim 6, wherein the thermosetting resin (C) comprises 3.0 parts by mass or more to 50 parts by mass or less of the maleimide compound (F) based on 100 parts by mass in total of the thermosetting resin (C).

16. The resin composition according to claim 6, wherein the thermosetting resin (C) comprises from 10 parts by mass or more to 80 parts by mass or less of the epoxy resin (G) based on 100 parts by mass in total of the thermosetting resin (C).

17. The resin composition according to claim 6, wherein the thermosetting resin (C) comprises from 20 parts by mass or more to 80 parts by mass or less of the bismaleimide-triazine resin (H) based on 100 parts by mass in total of the thermosetting resin (C).

18. The resin composition according to claim 1, wherein the nanoparticles (A) are alumina nanoparticles.

19. A prepreg comprising a substrate and a resin composition according to claim 1, wherein the substrate is impregnated or coated with the resin composition.

20. The prepreg according to claim 19, wherein the substrate is one or more selected from the group consisting of E glass cloth, T glass cloth, S glass cloth, Q glass cloth, and an organic fiber.

21. A laminate comprising at least one prepreg according to claim 19.

22. A metal foil-clad laminate comprising a prepreg according to claim 19 and a metal foil laminated on the prepreg.

23. A printed-wiring board comprising an insulating layer and a conductor layer formed on the surface of the insulating layer, wherein the insulating layer comprises a resin composition according to claim 1.

* * * * *